US010388374B1

(12) United States Patent
Asnaashari et al.

(10) Patent No.: US 10,388,374 B1
(45) Date of Patent: Aug. 20, 2019

(54) PROGRAMMABLE LOGIC APPLICATIONS FOR AN ARRAY OF HIGH ON/OFF RATIO AND HIGH SPEED NON-VOLATILE MEMORY CELLS

(71) Applicant: Crossbar, Inc., Santa Clara, CA (US)

(72) Inventors: Mehdi Asnaashari, Danville, CA (US); Hagop Nazarian, San Jose, CA (US); Lin Shih Liu, Fremont, CA (US)

(73) Assignee: Crossbar, Inc., Santa Clara, CA (US)

( * ) Notice: Subject to any disclaimer, the term of this patent is extended or adjusted under 35 U.S.C. 154(b) by 134 days.

(21) Appl. No.: 15/591,925

(22) Filed: May 10, 2017

Related U.S. Application Data

(63) Continuation of application No. 14/992,718, filed on Jan. 11, 2016, now Pat. No. 9,659,646.

(51) Int. Cl.
| | | |
|---|---|---|
| *G11C 13/00* | (2006.01) | |
| *H01L 27/24* | (2006.01) | |
| *H01L 45/00* | (2006.01) | |
| *H04L 12/861* | (2013.01) | |

(52) U.S. Cl.
CPC ...... *G11C 13/0069* (2013.01); *H01L 27/2436* (2013.01); *H01L 45/16* (2013.01); *H04L 49/9063* (2013.01)

(58) Field of Classification Search
None
See application file for complete search history.

(56) References Cited

U.S. PATENT DOCUMENTS

| | | | |
|---|---|---|---|
| 5,324,998 A | 6/1994 | Powell | |
| 5,883,827 A | 3/1999 | Morgan | |
| 6,667,635 B1 | 12/2003 | Pi et al. | |
| 6,856,542 B2 | 2/2005 | Roy et al. | |
| 6,873,538 B2 | 3/2005 | Hush | |
| 6,912,146 B2 | 6/2005 | Gill | |
| 7,019,557 B2 | 3/2006 | Madurawe | |
| 7,046,687 B1 * | 5/2006 | Brown | H04L 45/7453 370/412 |
| 7,173,838 B2 | 2/2007 | Hanzawa et al. | |
| 7,288,960 B2 | 10/2007 | Kocan | |
| 7,321,237 B2 | 1/2008 | McCollum et al. | |
| 7,366,001 B2 | 4/2008 | Hanzawa et al. | |
| 7,463,056 B1 | 12/2008 | Anderson et al. | |
| 7,492,182 B2 | 2/2009 | McCollum et al. | |

(Continued)

OTHER PUBLICATIONS

Notice of Allowance for U.S. Appl. No. 14/992,718 dated Jan. 17, 2017, 29 pages.

*Primary Examiner* — Mohamed A Kamara
*Assistant Examiner* — Saad Khawar
(74) *Attorney, Agent, or Firm* — Wegman, Hessler

(57) ABSTRACT

A non-volatile programmable circuit configurable to perform logic functions, is provided. The programmable circuit can employ two-terminal non-volatile memory devices to store information, thereby mitigating or avoiding disturbance of programmed data in the absence of external power. Two-terminal resistive switching memory devices having high current on/off ratios and fast switching times can also be employed for high performance, and facilitating a high density array. For look-up table applications, input/output response times can be several nanoseconds or less, facilitating much faster response times than a memory array access for retrieving stored data.

20 Claims, 14 Drawing Sheets

(56) References Cited

U.S. PATENT DOCUMENTS

| | | | |
|---|---|---|---|
| 7,495,473 B2 | 2/2009 | McCollum et al. | |
| 7,542,326 B2 | 6/2009 | Yoshimura | |
| 7,630,259 B1 | 12/2009 | Han et al. | |
| 8,233,310 B2 | 7/2012 | Fujita et al. | |
| 8,437,187 B2 | 5/2013 | Yasuda et al. | |
| 9,306,851 B1* | 4/2016 | Gazit | H04L 45/748 |
| 2003/0179623 A1* | 9/2003 | Inoue | G11C 15/04 |
| | | | 365/200 |
| 2004/0125808 A1* | 7/2004 | Regev | G06F 7/74 |
| | | | 370/395.42 |
| 2005/0045919 A1 | 3/2005 | Kaeriyama et al. | |
| 2006/0077737 A1 | 4/2006 | Ooishi | |
| 2006/0097343 A1 | 5/2006 | Parkinson | |
| 2007/0097740 A1* | 5/2007 | Derhacobian | G11C 11/5678 |
| | | | 365/163 |
| 2008/0049487 A1* | 2/2008 | Yoshimura | G11C 11/22 |
| | | | 365/148 |
| 2010/0027327 A1 | 2/2010 | Chung et al. | |
| 2013/0033929 A1 | 2/2013 | Kim | |
| 2013/0054886 A1* | 2/2013 | Eshraghian | G11C 13/0007 |
| | | | 711/108 |
| 2013/0232328 A1 | 9/2013 | Johnson | |
| 2013/0242640 A1 | 9/2013 | Haukness et al. | |
| 2014/0292368 A1 | 10/2014 | Nazarian | |
| 2015/0235703 A1* | 8/2015 | Sakimura | G11C 15/046 |
| | | | 365/49.17 |
| 2016/0232978 A1* | 8/2016 | De Santis | G11C 16/10 |
| 2016/0307628 A1* | 10/2016 | Cambou | G06F 21/316 |

\* cited by examiner

PROGRAMMABLE LOGIC APPLICATIONS FOR AN ARRAY OF HIGH ON/OFF RATIO AND HIGH SPEED NON-VOLATILE MEMORY CELLS

CROSS-REFERENCE TO RELATED APPLICATION

The present application for patent is a continuation of U.S. patent application Ser. No. 14/992,718 (now U.S. Pat. No. 9,659,646), entitled PROGRAMMABLE LOGIC APPLICATIONS FOR AN ARRAY OF HIGH ON/OFF RATIO AND HIGH SPEED NON-VOLATILE MEMORY CELLS and filed Jan. 11, 2016, the disclosure of which is hereby incorporated by reference herein in its entirety and for all purpose.

TECHNICAL FIELD

The subject disclosure relates generally to resistive switching memory, and as one illustrative example, programmable, high-speed logic applications utilizing an array(s) of non-volatile resistive switching memory devices.

BACKGROUND

The inventor(s) of the present disclosure has proposed models of two-terminal memory devices that he expects to operate as viable alternatives to various memory cell technologies, such as metal-oxide semiconductor (MOS) type memory cells employed for electronic storage of digital information. Models of memory cells using two-terminal memory such as resistive-switching memory devices among others, are believed by the inventor(s) to provide some potential advantages over purely non-volatile FLASH MOS type transistors, including smaller die size, higher memory density, faster switching (e.g., from active to de-active, or vice versa), good data reliability, low manufacturing cost, fab-compatible processes, and other advantages, for example.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

In one or more disclosed embodiments, provided is a circuit comprising one or more arrays of non-volatile memory devices facilitating a logical operation. In some embodiments, a circuit can be constructed to facilitate a programmable logical AND operation. In other embodiments, a circuit can be constructed to facilitate a programmable lookup table, or facilitate programmable activation/deactivation of a set of wordlines in response to input of associated code signals.

Various non-volatile memory devices can be utilized to achieve target performance metrics for one or more logic applications, depending on capabilities of the non-volatile memory device chosen. Suitable non-volatile memory devices can include two-terminal memory devices. Examples can include, but are not limited to, resistive-switching memory, phase-change memory, magneto-resistive memory, conductive-bridging memory, and so on. In particular embodiments, two-terminal resistive switching non-volatile memory cells can be employed to achieve a high on/off current ratio (e.g., three or four orders of magnitude, or greater), a fast switching speed (e.g., hundreds of nanoseconds, or less), among other characteristics.

In still other embodiments, disclosed is a distribution circuit for a router device. The distribution circuit can be programmed to identify a set of incoming client identifiers (e.g., identification codes, device codes, Internet Protocol addresses, MAC addresses, etc.) and programmed to associate a set of downstream distribution nodes with subsets of the incoming client identifiers. As one example, a distribution circuit can comprise a logical AND circuit that can be programmed to identify a set of received client IP addresses and a logical NOR circuit that can be programmed to determine a suitable downstream distribution node for respective client IP addresses. Thus, a network router utilizing the distribution circuit can enter an IP address at an input to the logical AND circuit, and retrieve a downstream distribution node for the IP address as an output of the logical NOR circuit. Such a distribution circuit can achieve lookup times of about several nanoseconds, or less, which can be far faster than conventional devices. Moreover, because the distribution circuit utilizes non-volatile memory, the programmability can be resistant or immune to memory loss due to loss of power, or other temporal conditions. Conventional devices utilizing DRAM or SRAM for storing data cannot easily achieve this resistance to data loss.

A network router device, comprising: a plurality of programmable logic devices each comprising a transistor of a set of transistors, respective transistors having a gate, a source and a drain, and comprising a resistive memory device of a set of resistive memory devices, respective resistive memory devices having a first terminal and a second terminal, wherein respective drains of the set of transistors are coupled to respective first terminals of the set of resistive memory devices for each of the plurality of programmable logic devices, and respective second terminals of the set of resistive memory devices are coupled to a ground, and wherein each of the set of resistive memory devices is characterized by programmable high resistance or low resistance state; a plurality of logical inputs, wherein each of the plurality of logical inputs is coupled to the gate of respective transistors of the set of transistors; and a logical output coupled to the sources of the respective transistors; wherein the set of resistive memory devices is configured to have a programmable pattern of resistance states, the programmable pattern comprising a high resistance state, a low resistance state, or a combination of high resistance and low resistance states.

In one or more embodiments, the subject disclosure provides an apparatus comprising a circuit. The circuit can comprise a set of input lines configured to receive an input, and an output line. The circuit can further comprise a pullup-circuit connected to and configured to apply a default voltage to the output line. Moreover, the circuit can comprise a set of programmable two-terminal switching devices respectively having a first terminal and a second terminal, wherein respective first terminals of the set of programmable two-terminal switching devices are connected to respective ones of the set of input lines and the second terminals of the set of programmable two-terminal switching devices are connected to the output line. In various embodiments, the set of programmable two-terminal switching devices are programmed to a programmed pattern, and the set of programmable two-terminal switching devices are in a non-conductive state in response to the input matching the programmed pattern. In further embodiments, at least one of the set of programmable two-terminal switching devices is in a conductive state in response to the input not matching the programmed pattern.

According to one or more aspects of the present disclosure, provided is a method of fabricating a circuit. The method can comprise forming a set of signal input lines and forming a signal output line. Moreover, the method can comprise forming a voltage pull-up circuit connected to the signal output line and configured to apply a default voltage to the signal output line. Additionally, the method can comprise forming a set of non-volatile, programmable circuits that, collectively, are reversibly programmable to store a program pattern, wherein respective circuits of the set of non-volatile, programmable circuits are located at respective intersections of the set of signal input lines and the signal output line, and are configured to pull-down the default voltage to a lesser magnitude voltage in response to a signal received on the set of signal input lines not matching the program pattern.

In a further embodiment, disclosed is a method for operating a network router device. The method can comprise receiving a data packet comprising a network address at an input interface of the network router device and entering the network address onto a set of input signal lines of the network router device. In addition, the method can comprise referencing a set of downstream port lines of the network router device in response to entering the network address, wherein the set of input signal lines generate network address outputs that serve as inputs to the set of downstream port lines and measuring output signals of the set of downstream port lines in response to entering the network address. Moreover, the method can comprise identifying a downstream port line of the set of downstream port lines that is associated with the network address from measured output signals of the set of downstream port lines and transmitting the data packet on a downstream port associated with the downstream port line.

In another embodiment, the subject disclosure provides a method for operating a network router device comprising a set of address lines having respective non-volatile memory circuits for causing the set of address lines to generate a first output in response to an input match and to generate a second output in response to an input mismatch, and comprising a set of downstream port lines having respective second non-volatile memory circuits for associating respective subsets of the set of address lines with one of the set of downstream port lines. The method can comprise receiving a new address for programming to the network router device and identifying an available address line of the set of address lines for the new address. In addition to the foregoing, the method can comprise programming a non-volatile memory circuit of the respective non-volatile memory circuits connected to the available address line to match the new address such that, in response to input of the new address at the network router device, the available address line generates the first response.

In still further embodiments, the present disclosure provides a method for operating a network router device comprising programmable circuitry for linking a reconfigurable set of network addresses to a reconfigurable set of downstream ports, the network router device comprising a set of input lines connected to a set of network address outputs and a first programmable array of memory circuits for mapping respective network addresses to respective network address outputs, the set of network address outputs serving as inputs to a set of downstream port lines, the set of downstream port lines respectively associated with the set of downstream ports and having a second programmable array of memory circuits associating respective subsets of the network address outputs to respective ones of the set of downstream port lines. The method can comprise receiving a new downstream port address to be added to the reconfigurable set of downstream ports and identifying an available downstream port line of the set of downstream port lines. Further, the method can comprise storing an association between the available downstream port line and the new downstream port and programming a memory cell of the second programmable array of memory circuits connected to the available downstream port line and to a network address output of the set of network address outputs to associate a network address programmed to the network address output with the downstream port line and the downstream port address.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
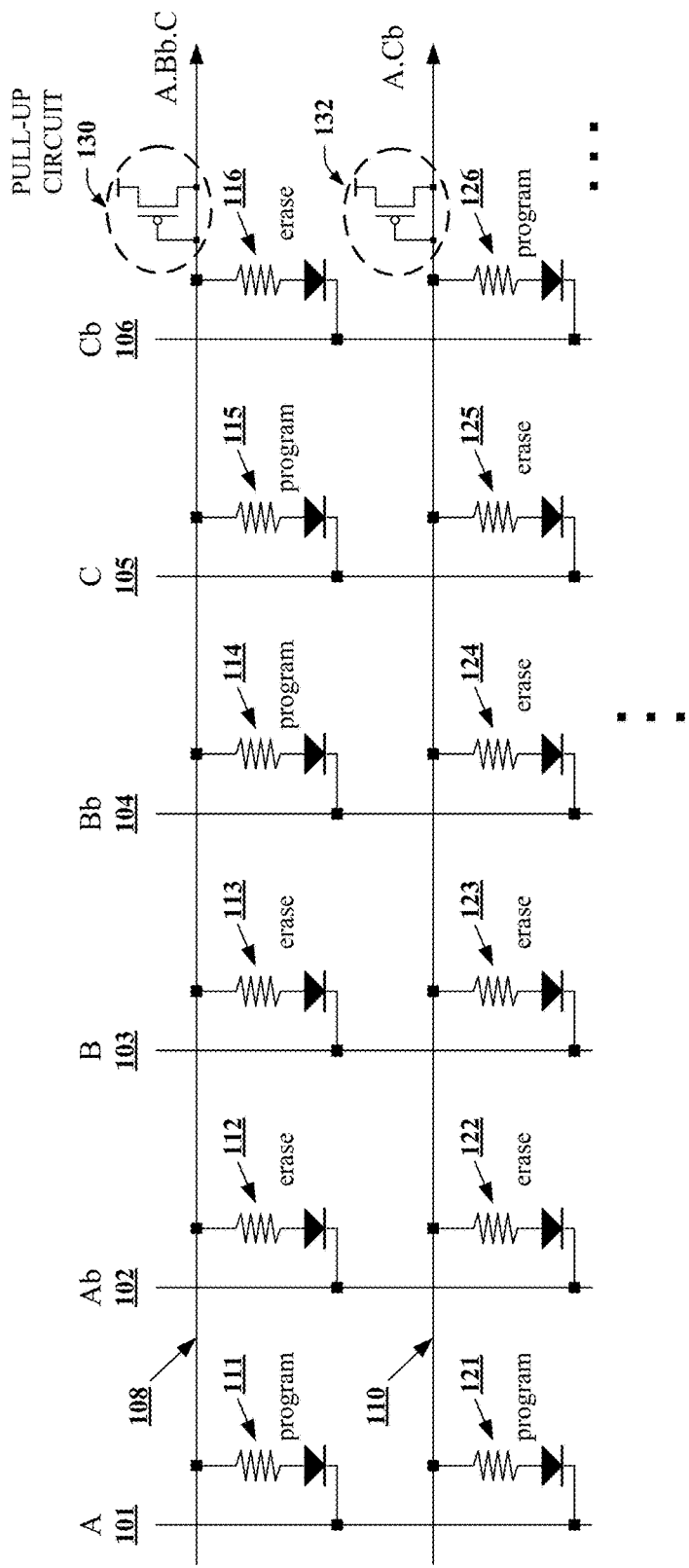
FIG. 1 illustrates a schematic diagram of an example programmable circuit configured for a logical AND operation, in one or more embodiments.

This disclosure relates to a programmable circuit configurable to perform logic functions, according to various embodiments. The programmable circuit can employ two-terminal non-volatile memory devices to store information, thereby mitigating or avoiding disturbance of programmed data in the absence of external power. Moreover, the programmable circuit can employ two-terminal resistive switching memory devices, in some embodiments, having high current on/off ratios and fast switching times. The high current on/off ratios can suppress leakage current, facilitating a high density array capable of storing large quantities of data. Moreover, the fast switching times facilitate responsive programming and re-programming, a desirable characteristic for many modern electronic applications, such as networking and computing devices. In addition, input/output response times can be several nanoseconds or less, facilitating much faster response times than an array access, employed in some conventional devices.

Referring more generally to the disclosed embodiments, two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having a pair of conductive contacts with an active region between the conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the conductive contacts. These electrical signals can be selected to have suitable characteristics, such as a voltage or current value, a voltage or current polarity, a field strength, a field polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM).

Programmable arrays described in the subject disclosure can be filamentary-based devices, in various embodiments, including, e.g., a non-volatile memory device, a volatile selector device, a combination of the foregoing, or a similar device. Composition of filamentary-based devices can vary per device, with different components selected to achieve desired characteristics (e.g., volatility/non-volatility, on/off current ratio, switching time, read time, memory durability, program/erase cycle, and so on). One example of a filamentary-based device can comprise: a conductive layer, e.g., metal, metal-alloy, metal-nitride, doped p-type (or n-type) silicon (Si) bearing layer (e.g., a p-type or n-type Si bearing layer, p-type or n-type polysilicon, p-type or n-type polycrystalline SiGe, etc.), a resistive switching layer (RSL) and an active metal-containing layer capable of being ionized. Under suitable conditions, the active metal layer can provide filament-forming ions to the RSL. In such embodiments, a conductive filament (e.g., formed by the ions) can facilitate electrical conductivity through at least a subset of the RSL, and a resistance of the filament-based device can be determined, as one example, by a tunneling resistance between the filament and the conductive layer.

A RSL (which can also be referred to in the art as a resistive switching media (RSM)) can comprise, e.g., an undoped amorphous Si-containing layer, a semiconductor layer having intrinsic characteristics, a Si sub-oxide (e.g., SiOx wherein x has a value between 0.1 and 2), and so forth. Other examples of amorphous and/or non-stoichiometric materials suitable for the RSL could include $Si_xGe_yO_z$ (where X, Y and Z are respective suitable positive numbers), a silicon oxide (e.g., $SiO_N$, where N is a suitable positive number, a silicon oxynitride), amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) and so forth, a nitride (e.g. AN, SiN), or a suitable combination thereof.

In some embodiments, a RSL employed as part of a non-volatile memory device (non-volatile RSL) can include a relatively large number (e.g., compared to a volatile selector device) of material voids or defects to trap neutral metal particles (at least at low voltage) within the RSL. The large number of voids or defects can facilitate formation of a thick, stable structure of the neutral metal particles. In such a structure, these trapped particles can maintain the non-volatile memory device in a low resistance state in the absence of an external stimulus (e.g., electrical power), thereby achieving non-volatile operation. In other embodiments, a RSL employed for a volatile selector device (volatile RSL) can have very few material voids or defects. Because of the few particle-trapping voids/defects, a conductive filament formed in such an RSL can be quite thin, and unstable absent a suitably high external stimulus (e.g., an electric field, voltage, current, joule heating, or a suitable combination thereof). Moreover, the particles can be selected to have high surface energy, and good diffusivity within the RSL. This leads to a conductive filament that can form rapidly in response to a suitable stimulus, but also deform quite readily, e.g., in response to the external stimulus dropping below a deformation magnitude. Note that a volatile RSL and conductive filament for the selector device can have different electrical characteristics than a conductive filament and non-volatile RSL for the non-volatile memory device. For instance, the selector device RSL can have higher material electrical resistance, and can have higher on/off current ratio, among others.

An active metal-containing layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, nitrides, alloys, or combinations of the foregoing or similar materials can be employed for the active metal layer in some aspects of the subject disclosure. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, and the following U.S. patent application assigned to the assignee of the present application for patent: application Ser. No. 14/588,185 filed Dec. 31, 2014; each of the foregoing patent applications are hereby incorporated by reference herein in their respective entireties and for all purposes.

In some disclosed embodiments, a filamentary based selector device can operate in a bipolar fashion, behaving differently in response to different polarity (or direction, energy flow, energy source orientation, etc.) external stimuli. As an illustrative example, in response to a first polarity stimulus exceeding a first threshold voltage (or set of voltages), the filamentary selector device can change to the second state from the first state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrically conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

For a non-volatile filamentary-based memory cell, a conductive path or a filament forms through a non-volatile RSL in response to a suitable program voltage applied across the memory cell. In particular, upon application of a programming voltage, metallic ions are generated from the active metal-containing layer and migrate into the non-volatile RSL layer. The metallic ions can occupy voids or defect sites within the non-volatile RSL layer. In some embodiments, upon removal of the bias voltage, the metallic ions become neutral metal particles and remain trapped in voids or defects of the non-volatile RSL layer. When sufficient particles become trapped, a filament is formed and the memory cell switches from a relatively high resistive state, to a relatively low resistive state. More specifically, the trapped metal particles provide the conductive path or filament through the non-volatile RSL layer, and the resistance is typically determined by a tunneling resistance through the non-volatile RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the non-volatile RSL become mobile ions and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information. In various embodiments, multi-level information (e.g., multiple bits) may be stored in such memory cells.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

FIG. 1 illustrates a schematic diagram of an example programmable logical circuit according to one or more embodiments of the present disclosure. The programmable logic circuit illustrated by FIG. 1 is a captioned a 1 resistor (1R) array with programmable logical 'AND' operation 100. As depicted, the programmable logic circuit comprises a set of input lines, including input lines: A 101 and A bar (a bar input being defined herein as an inverse signal of a non-bar input; e.g., the inverse of A in this case, and indicated as: Ab) 102, B 103 and Bb 104, C 105 and Cb 106 (referred to collectively as input lines 101-106). Additionally, intersecting the input lines 101-106 are a set of output lines, including: a first output line 108 and a second output line 110 (referred to collectively as output lines 108-110).

Although six input lines and two output lines are depicted for the logic circuit of FIG. 1, the subject disclosure is not limited by the size of the array. Rather, much larger (or smaller) arrays can be achieved, with larger (or smaller) numbers of input lines or larger (or smaller) numbers of output lines, depending on application. For instance, a programmable logical array with hundreds or thousands of input lines (or other suitable number), representing digits and inverse digits of an input code, and thousands or millions of output lines (or other suitable number), representing associated logical permutations of the input code, is within the scope of the present disclosure. As another example, an array can have different sets of input lines—each set representing a different input code—and output lines for determining a match for different instances of the respective input codes, is also within the scope of the present disclosure.

At an intersection of each of input lines 101-106 and output lines 108-110 is a memory circuit comprising a programmable (including one-time programmable, in some embodiments, and fully rewritable, in other embodiments), two-terminal non-volatile memory device. Particularly, memory circuits connected to output line 108 include memory circuits 111, 112, 113, 114, 115 and 116 (referred to collectively as memory circuits 111-116), whereas memory circuits connected to output line 110 include memory circuits 121, 122, 123, 124, 125 and 126 (referred to collectively as memory circuits 121-126). Respective memory circuits 111-116, 121-126 comprise a first terminal connected to a programmable resistive switching device and a diode connected to a second terminal, with a common node between the resistive switching device and the diode. Additionally, the first terminal is connected to one of the input lines 101-106, as depicted, and the second terminal of each of memory circuits 111-116 is connected to output line 108, and a second terminal of each of memory circuits 121-126 is connected to output line 110. The diode is oriented to permit current flow from the output line 108, 110 to the input line 101-106. In other embodiments, a volatile selector device, described above, may alternatively be used.

Memory circuits 111-116 and 121-126 can be two-terminal resistive switching devices, in one or more embodiments, that can be programmed (and erased) in response to a programming signal applied across respective first and second terminals. Memory circuits 111-116 and 121-126 can be programmed independently, or in subsets, by controlling respective signals on subsets of input lines 101-106 and output lines 108, 110. For instance, programming all of memory circuits 111-116 can be accomplished by applying a programming voltage (e.g., 3 volts, etc.) at each of input lines 101-106, while grounding output line 108, to drop the programming bias across each of memory circuits 111-116. In this example, output line 110 can be left floating (or driven to an intermediate voltage, such as 1.5 volts) to inhibit memory circuits 121-126 from being programmed.

As another example, to program a subset of memory circuits 111-116, while inhibiting memory circuits 121-126 from the programming, the programming voltage can be applied to an associated subset of input lines 101-106, while a second subset of input lines 101-106 is left floating, or driven at an intermediate voltage (e.g., an inhibit voltage, such as 1.5 volts, or a suitable voltage within a range of about 1 volts to about 2 volts, or other suitable range, depending on program/inhibit characteristics of memory circuits 111-116). Utilizing the example depicted by FIG. 1, memory circuit 111, memory circuit 114 and memory circuit 115 are programmed in response to application of the programming voltage to input lines A 101, Bb 104 and C 105, while grounding output line 108, and floating (or inhibiting) input lines Ab 102, B 103 and Cb 106. The result of such programming is a first program pattern, stored at memory circuits 111-116. To keep memory circuits 121-126 from storing the first program pattern, output line 110 can be floating (or inhibited) while the programming voltage is applied to the associated subset of input lines 101-106.

To program a second program pattern to memory circuits 121-126, output line 110 can be grounded while a programming voltage is applied to a third subset of input lines 101-106. Meanwhile, to avoid a change to the first program pattern stored at memory circuits 111-116, output line 108 can be left floating, or inhibited. Utilizing the pattern for memory circuits 121-126 depicted by FIG. 1, the second program pattern is accomplished by applying the programming voltage to input lines A 101 and Cb 106, while floating (or inhibiting) lines Ab 102, B 103, Bb 104 and C 105. Memory circuits 121 and 126 become programmed, and memory circuits 122, 123, 124 and 125 remain erased, as depicted.

In operation, a set of pull-up circuits 130 and 132 can be configured to apply a source voltage to output lines 108, 110, respectively. The source voltage can be equivalent to a supply voltage utilized for the 1R array with programmable logical AND operation 100, in various embodiments. As an example, the supply voltage can be selected from a range of about 0.9 volts to about 1.8 volts in some embodiments, though this range is not limiting and other voltages or ranges of voltages can be employed, where suitable. An input signal is applied at input lines 101-106, and a change or lack of change in the source voltage at the output lines 108, 110 can be determinative of whether a program pattern of memory circuits on that output line 108, 110, matches the input signal. Or with different words, voltages on respective output lines, in response to an input signal, can identify whether a program pattern at any of the respective output lines matches the input signal.

Programmed memory circuits 111-116, 121-126, being in a low resistance state (e.g., a programmed state), can conduct current in response to a suitable bias, whereas memory circuits 111-116, 121-126 in an erase state will not conduct an appreciable current, as they are in a high resistance state. Because a supply voltage is applied by pull-up circuits 130, 132 to output lines 108, 110 respectively, the supply voltage is also applied to respective second terminals of memory circuits 111-116, 121-126 that are connected to the output lines 108, 110. Therefore, zero volts (or other suitable voltage differential, relative to the supply voltage) applied at one of input lines 101-106, will result in a voltage dropped across an associated one of memory circuits 111-116, and an associated one of memory circuits 121-126. If such memory circuit(s) is programmed, it will conduct current, resulting in a voltage divider effect on an associated output line(s) 108, 110. The voltage divider effect will measurably reduce the supply voltage on the associated output line(s) 108, 110, which indicates a comparative result of the program pattern and the input signal. To facilitate the voltage divider effect, pull-up circuits 130 and 132 can be selected to have an electrical resistance value(s) that is small compared to the electrical resistance of memory circuits 111-116 and 121-126 when in a programmed state (e.g., low resistance state). For instance, if the electrical resistance of pull-up circuit 130 is approximately $1/10^{th}$ the electrical resistance of a programmed memory circuits 111-116, a voltage at output line 108 will be pulled down to approximately $1/10^{th}$ the supply voltage in response to one of memory circuits 111-116 being in the programmed state. When all of memory circuits 111-116 are in a high resistance state, the voltage at output line 108 will be approximately equal to the supply voltage.

A comparative result at output lines 108, 110 can, respectively, be utilized to indicate one of a set of logical conditions as true. For instance, the comparative result can comprise the supply voltage being indicative of a first comparative result, and the measurably reduced supply voltage being indicative of a second comparative result. In various embodiments, 1R array with programmable logical AND operation 100 can employ the first comparative result (e.g., supply voltage on an output line) to indicate a match between the input signal and a program pattern stored by memory circuits on an output line having the first comparative result. Likewise, the second comparative result can indicate a mismatch between the input signal and the program pattern stored by the memory circuits on the output line. Where different program patterns are stored at different sets of memory circuits (e.g., memory circuits 111-116 being a first set of memory circuits, and memory circuits 121-126 being a second set of memory circuits, and so on), an input signal on input lines 101-106 can be concurrently matched with all the different program patterns, with respective matches/mismatches determined by referencing the comparative results (e.g., supply voltage, or reduced supply voltage, respectively) at respective output lines 108, 110. Thus, as an example, an output line 108, 110 that remains at the supply voltage matches the input signal, and an output line 108, 110 that drops to the reduced supply voltage is a mismatch for the input signal, according to one embodiment(s).

In some embodiments, a set of memory circuits (e.g., memory circuits 111-116) can be reprogrammed from a previous program pattern (or no program pattern), to an updated program pattern. This updated program pattern can therefore change which input signal(s) the output line associated with the set of memory circuits (e.g., output line 108) will have the supply voltage for, and which input signal(s) the output line will have the reduced supply voltage for.

Referring again to the example embodiments depicted by FIG. 1, the program pattern of memory circuits 111-116 is P-E-E-P-P-E (from left to right), which corresponds to high signals (e.g., equal or substantially equal to the supply voltage) for input lines A 101+Bb 104+C 105, or a program pattern of A.Bb.C. An input signal matching program pattern A.Bb.C (said differently, having the supply voltage on input lines A 101 and Bb 104 and C 105) will drop substantially no volts across the programmed memory circuits of memory circuits 111-116. Because no voltage or substantially no voltage is dropped across the programmed memory circuits, these memory circuits will not conduct an appreciable current. In contrast, a low voltage on any of the input lines A 101 or Bb 104 or C 105 will drop the voltage across output line 108 to a low state. Moreover, because the erased memory circuits of memory circuits 111-116 are in a high resistance state, they will also not conduct an appreciable current, whether they observe a high or low input signal. Thus, in response to the input signal matching program pattern A.Bb.C, output line 108 will remain at or substantially at the supply voltage. In contrast, the program pattern of memory circuits 121-126 is P-E-E-E-E-P (also from left to right), which corresponds to high signals for input lines A 101 and Cb 106, or a program pattern of A.Cb. A low voltage on any of the input lines A 101 or Cb 106 will drop the voltage across output line 110 to a low state. Voltage on B 103 or Bb 104 does not affect the output line 110 since the resistors on those lines are both in an erased (e.g., a high resistance) state.

Utilizing the above program patterns for memory circuits 111-116 and memory circuits 121-126 respectively, in operation, an input signal matching the A.Cb program pattern will result in the supply voltage (or substantially the supply voltage) on the output line 110. Notably, the A.Cb program pattern will result in the reduced supply voltage on output line 108 (in response to a low signal on input line C 105). Likewise, the A.Bb.C program pattern will result in the reduced supply voltage on output line 110 (in response to a low signal on input line Cb 106).

Figure 2:
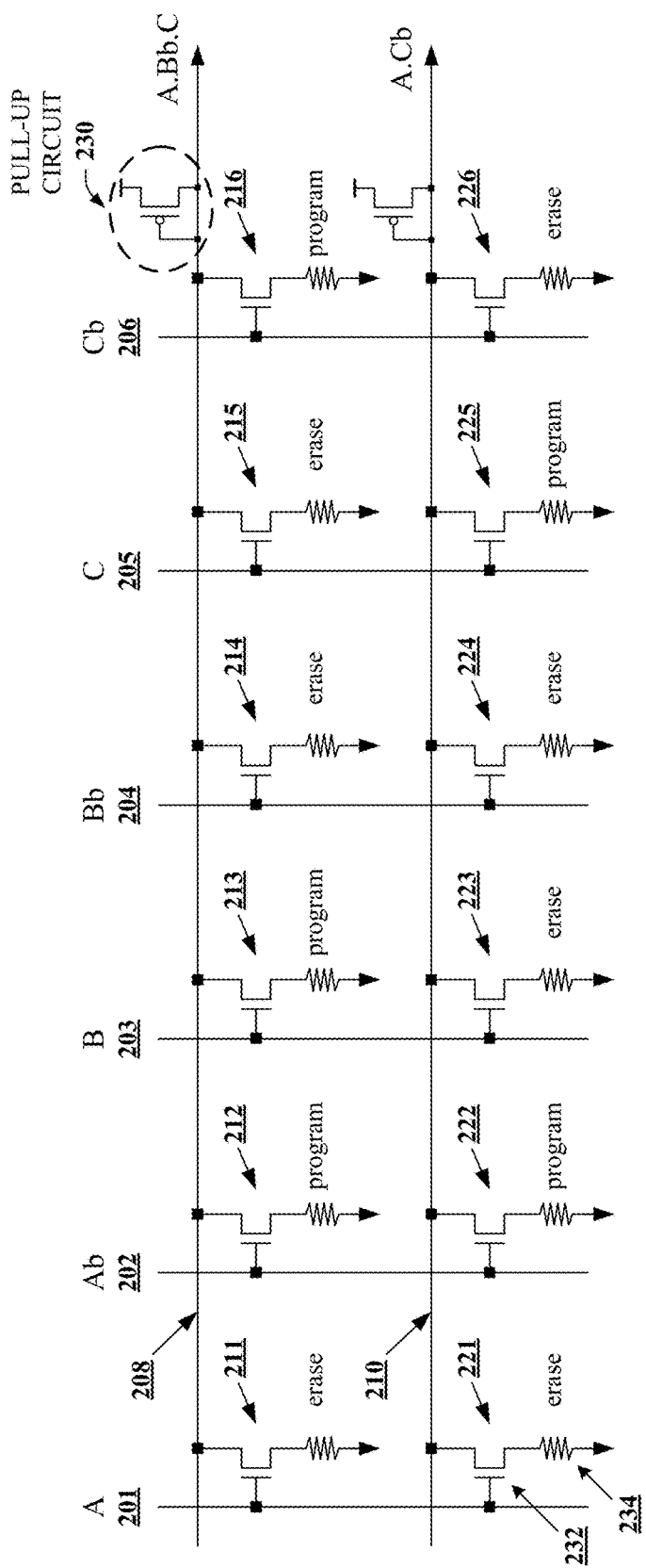
FIG. 2 depicts a schematic diagram of an alternative sample programmable circuit configured for a logical AND operation.

Referring now to FIG. 2, there is depicted an example alternative programmable logic circuit comprising a 1T1R array with programmable logical AND operation 200. The programmable logic circuit comprises a set of input lines, including input lines: A 201, Ab 202, B 203, Bb 204, C 205 and Cb 206 (referred to collectively as input lines 201-206), a set of output lines, including output lines 208, 210, and sets of memory circuits associated with the respective output lines 208, 210, including a first set of memory circuits: 211, 212, 213, 214, 215, and 216 (referred to collectively as memory circuits 211-216) and a second set of memory circuits: 221, 222, 223, 224, 225 and 226 (referred to collectively as memory circuits 221-226). The subject disclosure is not limited to the example depicted by FIG. 1, however; rather other numbers of input signals, output signals and memory circuits are considered to be within the scope of the subject disclosure.

In addition to the foregoing, the programmable logic circuit can comprise a set of pull-up circuits, including pull-up circuits 230. Each of output lines 208, 210 is connected to a pull-up circuit 230, which can be configured to apply a default voltage (e.g., a supply voltage, a voltage between about 1 volts and about 2 volts, or other suitable magnitude or range of magnitudes) to respective output lines 208, 210.

Memory circuits 211-216, 221-226 comprise a transistor 232 (e.g., an NMOS transistor) and a two-terminal resistive-switching memory 234 (with reference to memory circuit 221). The transistor has a gate connected to one of input lines 201-206, a source connected to one of output lines 208, and a drain connected to a first terminal of the two-terminal resistive-switching memory 234. A second terminal of the two-terminal resistive-switching memory 234 is connected to ground. In response to a high signal on an associated input line (e.g., input line A 201), transistor 232 activates and conducts current between the source and the drain. Thus, when transistor 232 is activated, the default voltage supplied by one of pull-up circuits 230 is applied to the first terminal of two-terminal resistive-switching memory 234. In various embodiments, the default voltage can have a magnitude equal to or larger than a read voltage associated with two-terminal resistive-switching memory 234, and smaller than a program voltage associated with two-terminal resistive-switching memory 234. Accordingly, the default voltage will not change a program state of two-terminal resistive-switching memory 234, but will generate an on-state current if two-terminal resistive-switching memory 234 is in a program state (e.g., a low resistance state), causing a voltage divider effect and reducing the default voltage on an associated output line to a reduced default voltage. In contrast, where an input line has a low voltage (deactivating transistor 232), or where a two-terminal resistive-switching memory 234 is erased, the default voltage on the output line is unaffected, or substantially unaffected.

Two-terminal resistive-switching memory 234 devices of memory circuits 211-216, 221-226 can be reversibly programmed to store a memory pattern. In the example depicted by FIG. 2, memory circuits 211-216 are programmed to the following memory pattern: E-P-P-E-E-P (from left to right). According to this pattern, memory circuits that have both a high signal on an associated one of input lines 201-206 and have a programmed two-terminal resistive-switching memory 234 will pull down a default voltage on an associated output line 208, 210. Memory circuits that have either a low signal on an associated input line 201-206, or that have an erased two-terminal resistive-switching memory 234 will not affect (or not substantially affect) the default voltage on the associated output line 208, 210. Accordingly, a high signal on input lines A 201, Bb 204 and C 205 (e.g., an input signal that satisfies a logical AND of input lines 201, 204 and 205), and low signals on the inverse of these signals: Ab 202, B 203 and Cb 206, will result in the default voltage on output line 208, verifying a logical AND at output line 208. A high signal on any of Ab 202, B 203 or Cb 206 (e.g., an input that does not satisfy a logical AND of input lines 201, 204 and 205) will reduce the default voltage on output line 208, invalidating the logical AND on output line 208.

Memory circuits 221-226 are programmed to a second memory pattern: E-P-E-E-P-E (from left to right). Memory circuit pair 223 and 224 corresponding to input B 203 and Bb 204 both being in an erased state indicates that the input B does not affect the logical AND function and therefore has no impact on output line 210. Thus, in more general terms, memory circuits 221-226 being in an erased state (e.g., a high resistance state) do not affect output line 210 regardless of the input lines 201-206. For the second memory pattern depicted by FIG. 2 then, inputs A 201, B 203, Bb 204, and Cb 206 do not have any effect on the output line 210. Only memory circuits 222 and 226 being in a programmed state (having low resistance) can affect the output line 210. A high signal on either of input lines Ab 202 or C 205 will result in the output line 210 being pulled to a low state. Otherwise, the output line 210 remains in its default state of high. Worded differently, low signals on Ab 202 and C 205 will result in output line 210 retaining it's default state of high which corresponds to a logical (A, Cb) operation.

Figure 3:
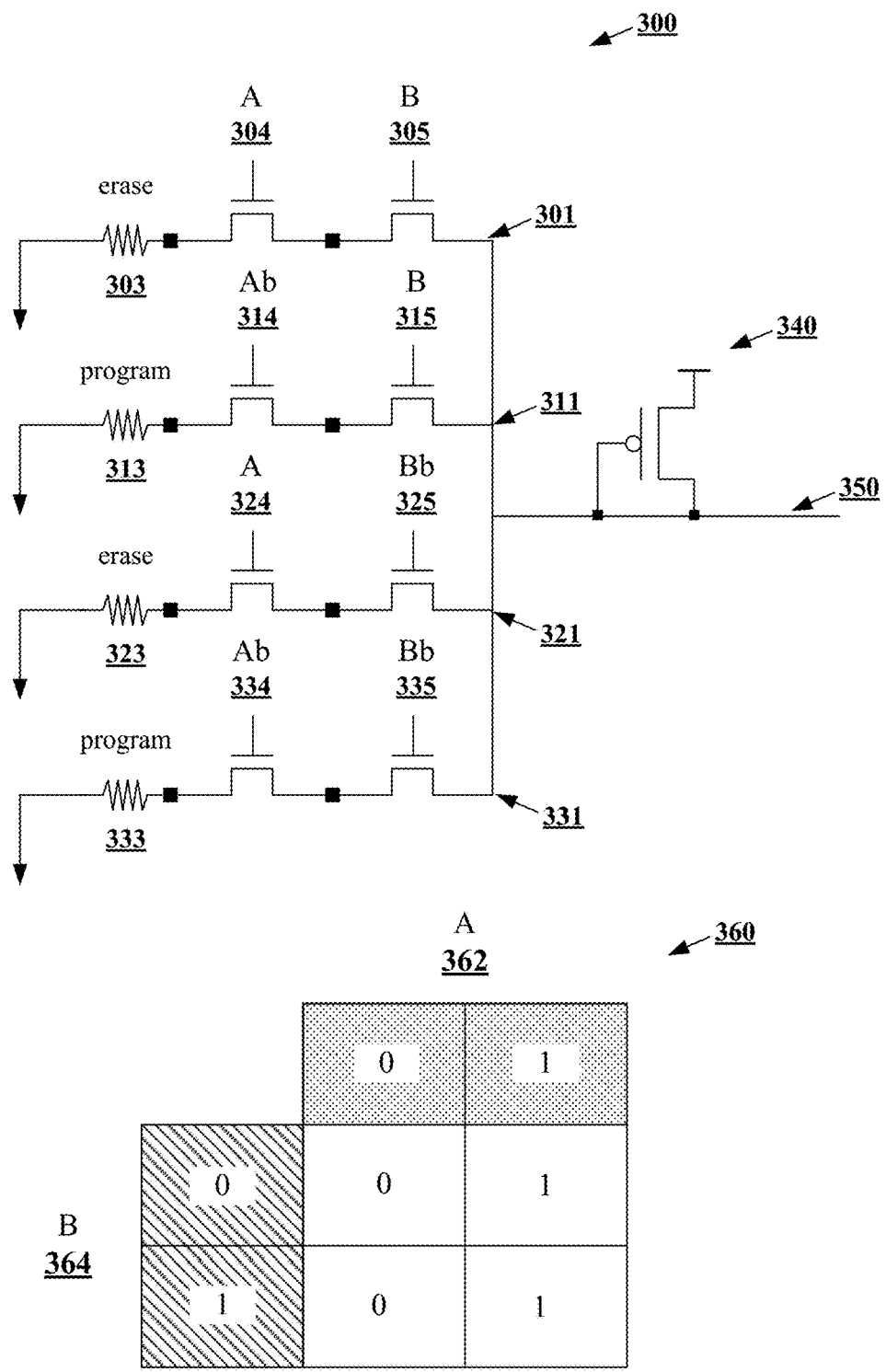
FIG. 3 depicts a schematic diagram of an example programmable circuit configured to implement a logical truth table, in an embodiment.

FIG. 3 illustrates a schematic diagram of an example circuit 300 for implementing a truth table 360, according to one or more embodiments. Circuit 300 is configured for a 2×2 binary truth table 360; however the subject disclosure is not so limited. In other embodiments, circuit 300 can be expanded to implement larger truth tables or non-binary truth tables, in various embodiments.

Circuit 300 can comprise a set of parallel nodes, including nodes 301, 311, 321 and 331 (referred to collectively as nodes 301-331), connected to an output line 350. Each of the parallel nodes has a set of transistors (e.g., NMOS transistors) and a two-terminal resistive-switching memory device. Gates of the transistor devices are connected to input lines associated with the states of truth table 360. For the 2×2 truth table of FIG. 3, each node 301, 311, 321 and 331 comprises a pair of transistors. Larger truth tables can have additional nodes, and additional transistors to represent different permutations of the truth table. Each of the input lines is associated with a high or low signal, which represents respective binary states for a parameter of truth table 360. In the example of truth table 360, the parameters are A 362 and B 364. Thus, each of the input lines is associated with a binary state of A 362, or a binary state of B 364. Node 301 comprises an A input 304 and a B input 305, and a two-terminal resistive-switching device 303. Likewise, node 311 comprises an Ab input 314, a B input 315, and a second two-terminal resistive-switching device 313, node 321 comprises an A input 324, a Bb input 325 and a third two-terminal resistive-switching device 323, and node 331 comprises an Ab input 334, a Bb input 335 and a fourth two-terminal resistive-switching device 333.

Two-terminal resistive-switching devices 303, 313, 323 and 333 (referred to collectively as memory devices 303-333) are connected at respective first terminals to a source or drain of a neighboring transistor and at respective second terminals to ground. When erased, two-terminal resistive-switching devices 303-333 are in a high resistive state and mitigate current flow through an associated node 301-331. When programmed, two-terminal resistive-switching devices 303-333 are in a low resistive state and facilitate current flow through an associated node 301-331. Further, memory devices 303-333 can be reversibly programmed to represent different truth tables, such as truth table 360 or logical variations thereof.

For truth table 360, a high output (e.g., a 1) is expected for A.Bb and for A.B, whereas a low output is expected for Ab.B and Ab.Bb. Accordingly, two-terminal resistive-switching device 303 associated with input lines A 304 and B 305 is erased, to avoid pulling down (e.g., by mitigating current flow) a default voltage on output line 350 provided by a pull-up circuit 340, in response to high values for input line A 304 and input line B 305. This corresponds with the value of '1' in truth table 360 for parameter A 362 being 1, and parameter B 364 being 1.

Two-terminal resistive-switching device 313 associated with input lines Ab 314 and B 315 is programmed. Thus, when Ab 314 and B 315 are high, two-terminal resistive-switching device 313 facilitates current flow on through node 311, pulling down the default voltage on output line 350. This corresponds to a low output, which matches the value of '0' in truth table 360 for parameter A 362 being 0, and parameter B 364 being 1.

Two-terminal resistive-switching device 323 associated with input lines A 324 and Bb 325 is erased. Thus when input lines A 324 and Bb 325 are high, two-terminal resistive-switching device 323 mitigates current flow on through node 321, maintaining the default voltage on output line 350. This corresponds to a high output, which matches the value of '1' in truth table 360 for parameter A 362 being 1, and parameter B 364 being 0.

Two-terminal resistive-switching device 323 associated with input lines Ab 334 and Bb 335 is programmed. Thus when Ab 334 and Bb 335 are high, two-terminal resistive-switching device 333 facilitates current flow on through node 331, pulling down the default voltage on output line 350. This corresponds to a low output, which matches the value of '0' in truth table 360 for parameter A 362 being 0, and parameter B 364 being 0.

Figure 4:
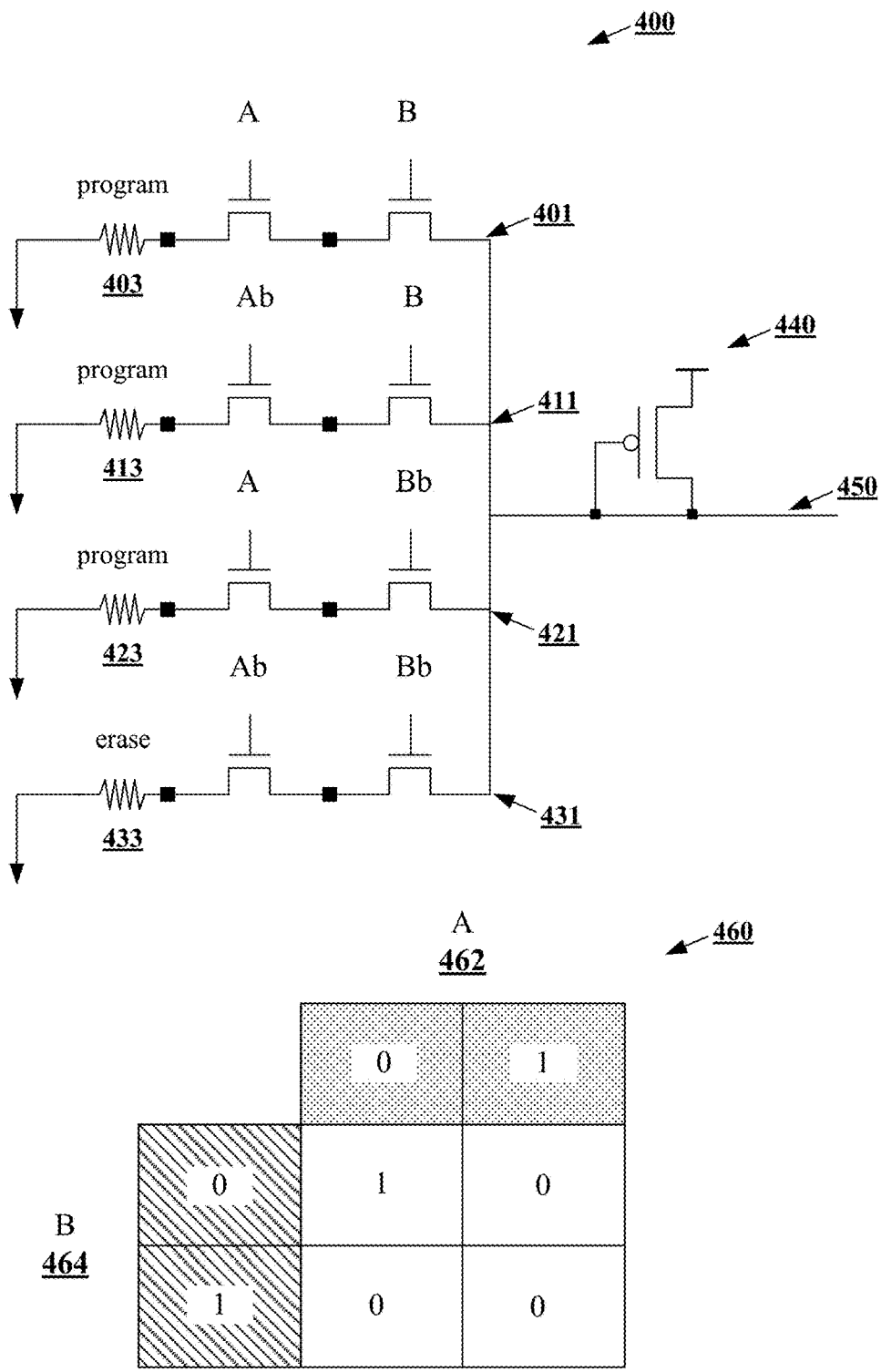
FIG. 4 illustrates a schematic diagram of an example programmable circuit configured to implement an alternate logical truth table.

Referring to FIG. 4, a schematic diagram of an example circuit 400 configured to implement a truth table 460 is depicted. Truth table 460 comprises two parameters, including parameter A 462 and parameter B 464, each with two values. Truth table 460 is set to be true when both parameter A 462 and parameter B 464 are 0 (or low), and false for all other combinations of parameter A 462 and parameter B 464. Circuit 400 is configured to implement truth table 460, by providing a high output on an output line 450 for a true condition, and a lowered output on output line 450 for a false condition. The high output is provided by a pull-up circuit 440; a set of nodes 401, 411, 421 and 431 (referred to collectively as nodes 401-431) can be configured to pull down the high output to the lowered output. Particularly, respective nodes 401-431 have a set of transistors matching a logical state of truth table 460 (e.g., A.B, Ab.B, A.Bb, Ab.Bb), and a two-terminal resistive-switching memory device that can be programmed to facilitate conduction of current on one of nodes 401-431, or can be erased to mitigate conduction of current. When associated inputs of the set of transistors go high on one of nodes 401-431, the program state of the two-terminal resistive-switching memory device will determine whether output line 450 is pulled down (false condition) or maintained high (true condition). Two-terminal resistive-switching memory devices 403, 413 and 423 associated with logical states A.B, Ab.B and A.Bb, respectively, are programmed, and therefore will pull down the voltage on output line 450, producing the false condition (0 state) for these logical states in truth table 460. In contrast, two-terminal resistive-switching memory device 433 associated with logical state Ab.Bb is erased, and will maintain the voltage on output line 450, producing the true condition (1 state) for this logical state in truth table 460.

Figure 5:
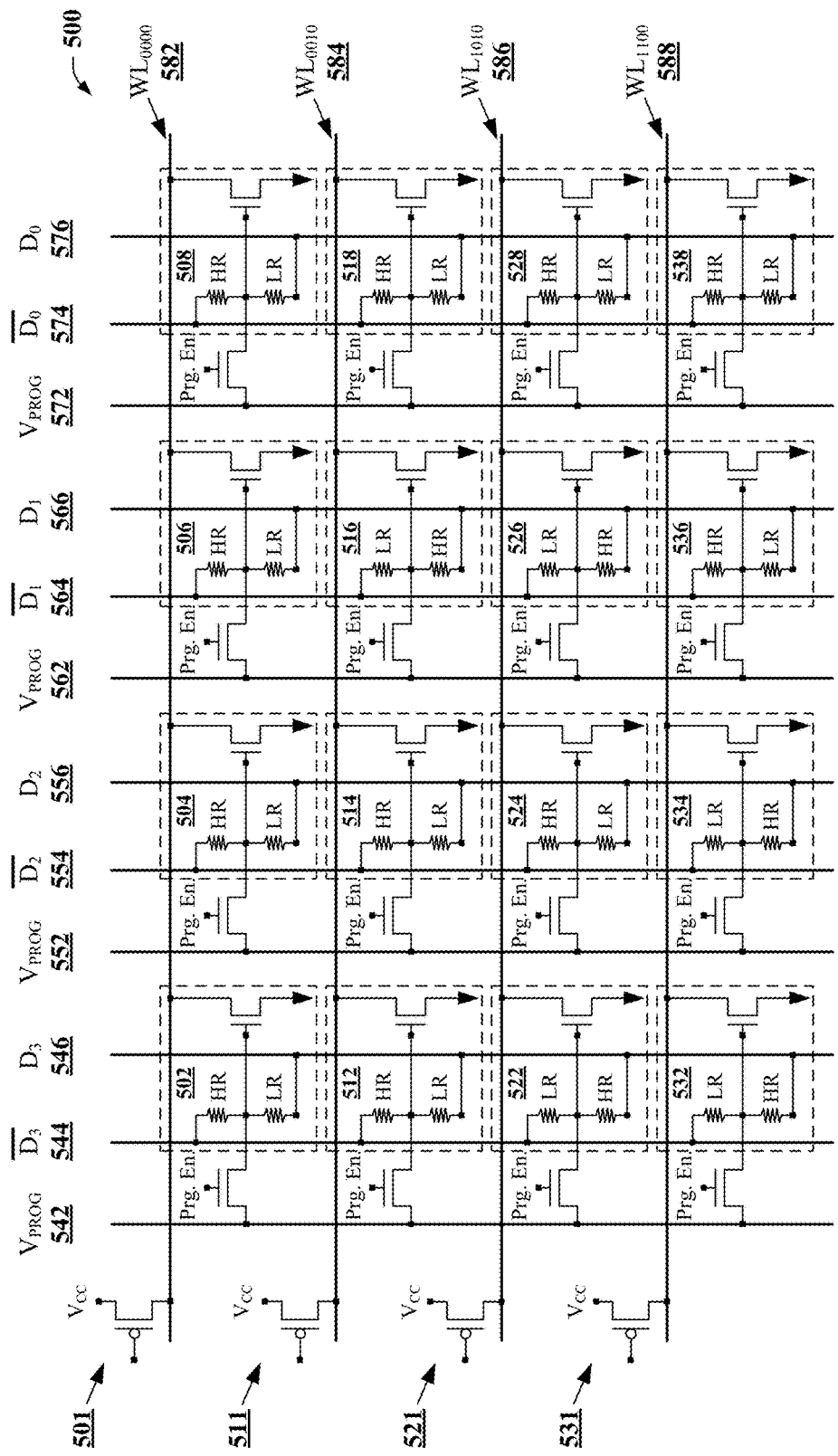
FIG. 5 depicts a schematic diagram of an example programmable circuit configured to activate/deactivate a wordline in response to an input code.

FIG. 5 depicts a schematic diagram of a sample circuit 500 for implementing a logical AND operation in one or more additional embodiments of the present disclosure. Circuit 500 is an array structure comprising sets of bitlines as signal inputs, including a first set of signal inputs: $D_0$ 576, $D_0$ bar (referred hereinafter as $D_0b$) 574 and program line (referred hereinafter as $V_{PROG}$) 572, a second set of signal inputs: $D_1$ 566, $D_1b$ 564 and $V_{PROG}$ 562, a third set of signal inputs: $D_2$ 556, $D_2b$ 554 and $V_{PROG}$ 552, and a fourth set of signal inputs: $D_3$ 546, $D_ab$ 544 and $V_{PROG}$ 542 (referred to collectively as bitlines 542-576). Intersecting the set of bitlines is a set of wordlines, including wordlines: $WL_{0000}$ 582, $WL_{0010}$ 584, $WL_{1010}$ 586 and $WL_{1100}$ 588 (referred to collectively as wordlines 582-588). Respective pull-up circuits 501, 511, 521, and 531 (referred to collectively as pull-up circuits 501-531) are connected to respective ones of wordlines 582-588.

At an intersection of respective sets of signal inputs and respective wordlines 582-588 is a memory circuit. Each memory circuit is configured to be controlled by one of the set of signal inputs, and programmed to either a pull-down configuration or a neutral configuration. The pull-down configuration can cause a memory cell to pull down an associated wordline voltage in response to a suitable input on an associated set of signal inputs. The neutral configuration has no effect (or substantially no effect) on the associated wordline voltage in response to an input signal. Thus by programming different memory circuits to the pull-down configuration or the neutral configuration, different sets of signal inputs (associated with respective programmed memory circuits) can be operable to pull down one, multiple, or none of wordlines 582-588, depending on the programming.

A first set of memory circuits is connected to $WL_{0000}$ 582. The first set of memory circuits includes memory circuits 502, 504, 506 and 508 (referred to collectively as first set of memory circuits 502-508) Likewise, a second set of memory circuits 512, 514, 516 and 518 (referred to collectively as second set of memory circuits 512-518) is connected to $WL_{0010}$ 584, a third set of memory circuits 522, 524, 526 and 528 (referred to collectively as third set of memory circuits 522-528) is connected to $WL_{1010}$ 586, and a fourth set of memory circuits 532, 534, 536 and 538 (referred to collectively as fourth set of memory circuits 532-538) is connected to $WL_{1100}$ 588. Note that the size of circuit 500, number of wordlines, number of bitlines or number of memory circuits are but a single embodiment and are not limiting; other suitable sizes or numbers of wordlines/bitlines/memory circuits can be implemented in other embodiments.

In operation, a set of pull-up circuits, including pull-up circuits 501, 511, 521 and 531 (referred to collectively as pull-up circuits 501-531) provide a default voltage on respective wordlines 582-588. A program pattern can be applied to the sets of input signals, and if a programmed state of the first, second, third or fourth set of memory circuits matches the program pattern, the default voltage will remain on a wordline(s) connected to the matching set(s) of memory circuits. If the program pattern does not match a programmed state of one of the set of memory circuits, the wordline(s) connected to the non-matching set(s) of memory circuits will have a reduced voltage, as described below. In an embodiment(s), non-volatile memory cells (e.g., two-terminal, resistive-switching non-volatile memory cells) can be employed for memory circuits of circuit 500, allowing non-volatile storage of distinct memory patterns at respective sets of memory circuits. In embodiments where circuit 500 comprises a large array of memory circuits and wordlines (e.g., hundreds of thousands, millions, billions, etc.), large numbers of memory patterns can also be stored. Further, a received program pattern can be matched to the stored program patterns by applying the received program pattern to the sets of signal inputs, and monitoring voltage at the wordlines. Accordingly, the received pattern can be quickly and efficiently identified, by sensing voltages on wordlines 582-588 of circuit 500.

Referring to memory circuit 502 (within the dashed line box), a pair of two-terminal resistive-switching memory devices are provided. A first two-terminal resistive-switching memory device of the pair of memory devices (the upper two-terminal resistive device) has a first terminal connected to signal input $D_ab$ 544, and a second terminal that is connected to a first terminal of a second two-terminal resistive-switching memory device (the lower two-terminal resistive device) of the pair of memory devices. Particularly, the second terminal of the first memory device and the first terminal of the second memory device are connected at a common node, which is also connected to a gate of a transistor of memory circuit 502 (e.g., an NMOS transistor). A second terminal of the second memory device is connected to signal input $D_3$ 546. The transistor is controlled by a voltage at the common node, which in turn is determined by voltages at signal input $D_3b$ 544 and $D_3$ 546, and the program states of the first memory device and second memory device.

In the embodiment depicted by FIG. 5, the first memory device of memory circuit 502 is programmed to a high resistance state, and the second memory device is programmed to a low resistance state. In response to a high voltage at signal input $D_3b$ 544 and low voltage at signal input $D_3$ 546, most of the high voltage is dropped across the first memory device (connected to the high voltage signal at signal input $D_3b$ 544), leaving a low voltage at the common node. Accordingly, the transistor is deactivated and does not affect or substantially affect the default voltage on $WL_{0000}$ 582. In response to a high voltage at signal input $D_3$ 546 and low voltage at $D_3b$ 544, the second memory device connected to the high voltage at signal input $D_3$ 546 drops little voltage. Accordingly, a significant voltage appears at the common node, and activates the transistor of memory circuit 502. This creates a parallel connection from $WL_{0000}$ 582 to ground, pulling down the default voltage on $WL_{0000}$ 582. Memory circuits 504, 506 and 508 are programmed similarly as memory circuit 502; thus, a high signal on signal input $D_2$ 556, signal input $D_1$ 566 or signal input $D_0$ 576 will likewise pull down the default voltage on $WL_{0000}$ 582. Accordingly, the memory pattern matching the first set of memory circuits 502-508, yielding the default voltage on $WL_{0000}$ 582, is 0-0-0-0. Second set of memory circuits 512-518 are programmed to a 0-0-1-0 program pattern. In response to an input signal matching the 0-0-1-0 pattern, $WL_{0010}$ 584 will maintain the default voltage; another input signal will result in a reduced voltage at $WL_{0010}$ 584. Likewise, the third set of memory circuits and fourth set of memory circuits are programmed to a 1-0-1-0 pattern and a 1-1-0-0 pattern, respectively. Similarly, wordlines $WL_{1010}$ 586 and $WL_{1100}$ 588 will have the default voltage in response to respective input signals that match associated program patterns, and have the lowered voltage in response to mismatched input signals.

Figure 6:
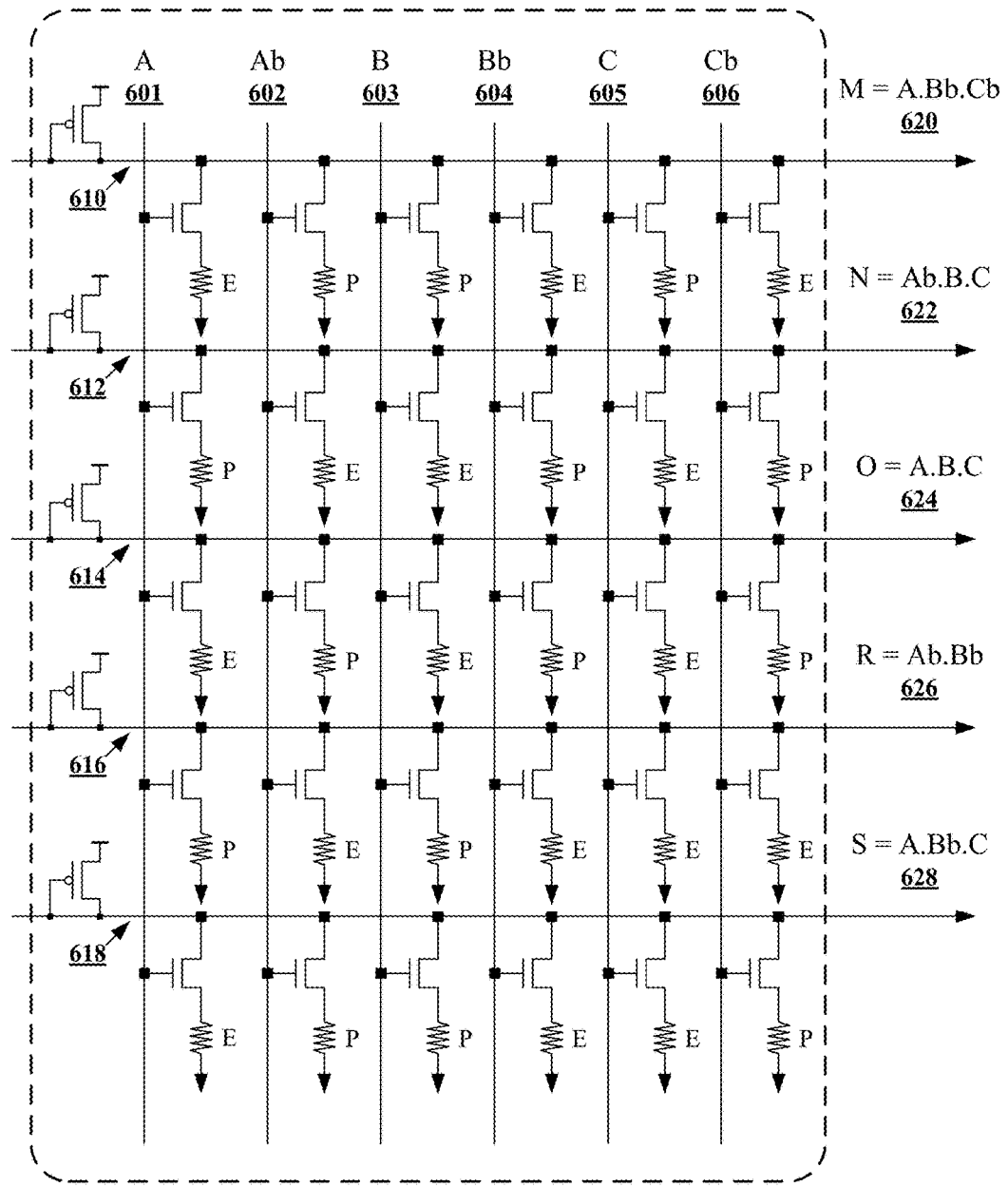
FIG. 6 illustrates a schematic diagram of an example programmable circuit for performing a logical AND operation in a lookup table for a router device.
Figure 7:
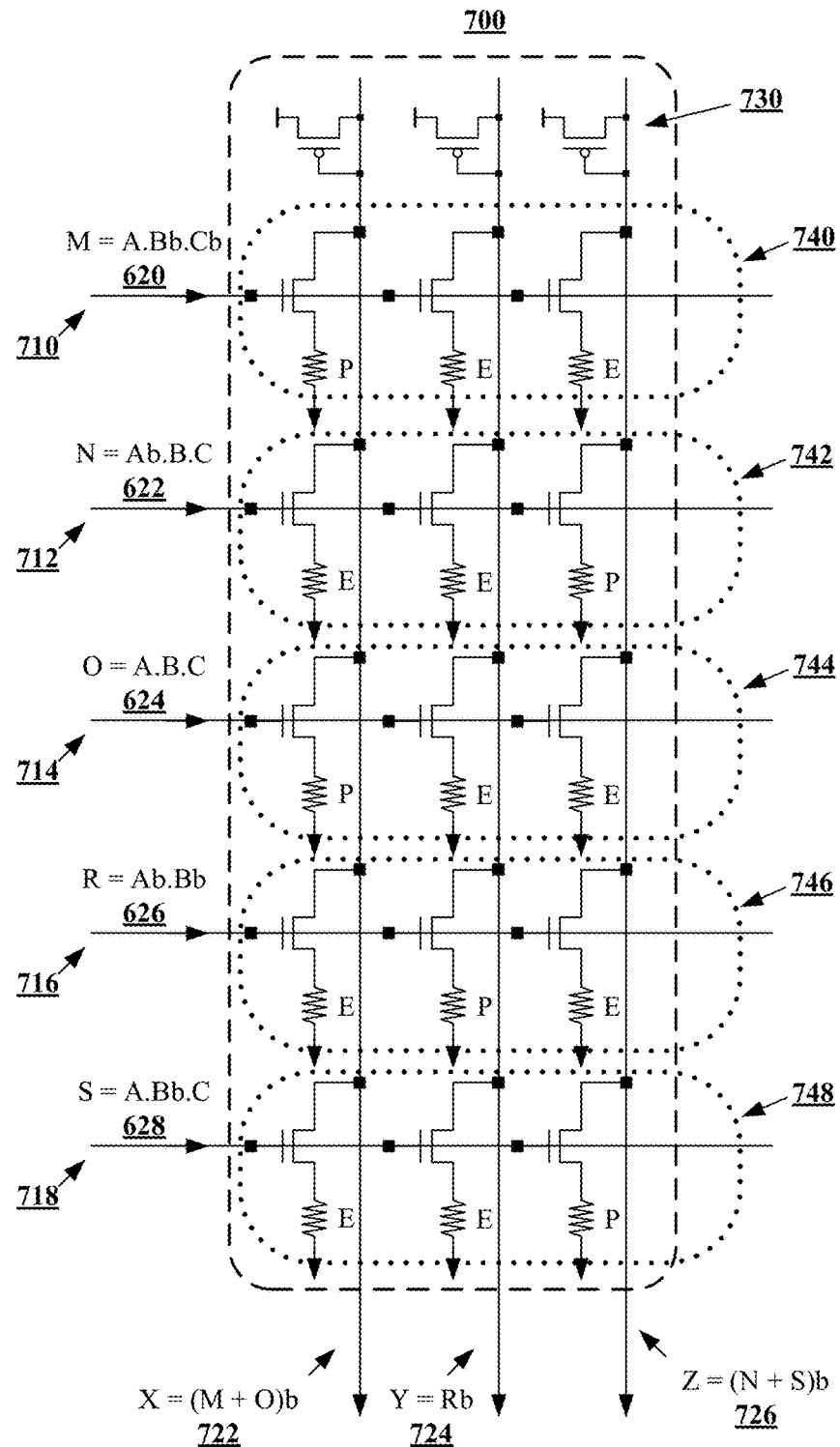
FIG. 7 illustrates a schematic diagram of an example programmable circuit for performing a logical NOR operation in the lookup table for the router device.

FIGS. 6 and 7 depict schematic diagrams of a circuit 600 configured to implement a logical AND operation, and a circuit 700 configured to implement a logical NOR operation, respectively. In one or more embodiments, circuits 600 and 700 can be integrated to implement a programmable, high-speed lookup table. The lookup table can be utilized for a variety of applications. In one example embodiment, the lookup table can store a set of network addresses at circuit 600, and can correlate subsets of the network addresses with a set of downstream port addresses at circuit 700. This can be utilized in a network routing device, for instance, to retrieve a downstream port address for a received packet. A process (e.g., a processor implementing the process) can extract a destination IP address from the received packet, enter the destination IP address as an input to circuit 600, and retrieve the downstream port address as an output from circuit 700. In further embodiments, circuit 600 and 700 can utilize non-volatile resistive-switching memory cells to store the network addresses and downstream port addresses. This can render the routing device resistant to loss of data from a power outage, as an example. Further, because the memory cells are programmable, new addresses can be added, old addresses can be overwritten, an existing address(es) can be routed to a different downstream port(s) and so on, by programming suitable subsets of the memory cells. Moreover, because the lookup table is implemented in hardware, DRAM read operations (employed by many conventional routing devices) are not required to retrieve a downstream port address. Rather, output nodes of circuit 700 can be sampled to determine the downstream port address, which can be implemented much more quickly than multiple DRAM read operations. In some embodiments, the downstream port address can be acquired in a few nanoseconds (e.g., 5 nanoseconds), as opposed to tens of nanoseconds, resulting in higher performance for the routing device.

Circuit 600 comprises a set of input lines, including input lines: A 601, Ab 602, B 603, Bb 604, C 605 and Cb 606 (referred to collectively as input lines 601-606). Intersecting input lines 601-606 is a set of output lines: 610, 612, 614, 616 and 618 (referred to collectively as output lines 610-618). Output lines 610-618 have a default voltage applied by an associated pull-up circuit as an initial condition for output lines 610-618. Sets of memory cells at respective output lines 610-618 can be programmed to store different program patterns. These program patterns can represent any suitable data entity, depending on application (e.g., a network address or IP address for an address lookup application, or other suitable data entity for other applications). As described herein, an input signal provided at signal inputs 601-606 can change the default voltage on at least a subset of output lines 610-618. Particularly, a signal input that does not match a program pattern stored by memory cells at one of output lines 610-618, will pull down (e.g., reduce) the default voltage on that output line, and any other output line having a program pattern that does not match the signal input. Only an output line(s) with memory cells having a stored data pattern that matches the signal input will remain at the default voltage.

In the example illustrated by circuit 600, each of output lines 610-618 is associated with a distinct program pattern. Output line 610 has a first program pattern equal to A.Bb.Cb; an output signal M 620 of output line 610 equals the default voltage in response to an input signal matching the first program pattern, and is a reduced voltage otherwise. Similarly, output line 612 has an output signal N 622 associated with a second program pattern equal to Ab.B.C; output line 614 has an output signal O 624 associated with a third program pattern equal to A.B.C; output line 616 has an output signal R 626 associated with a fourth program pattern equal to Ab.Bb; output line 618 has an output signal S 628 associated with a fifth program pattern equal to A.Bb.C.

Similar to output signal M620, any of output signals N 622, O 624, R 626 and S 628 equal the default voltage in response to an input signal matching an associated program pattern, and at the reduced voltage otherwise.

Referring now to FIG. 7, a circuit 700 is depicted that receives output signals M 620, N 622, O 624, R 626 and S 628 (referred to collectively as output signals 620-628) as inputs, and determines an output of a set of programmable outputs in response to a state of the inputs. The output signals 620-628 are received on a set of input lines: 710, 712, 714, 716 and 718 (referred to collectively as input lines 710-718). Input lines 710-718 are respectively connected to respective output lines 610-618 of circuit 600, to facilitate transfer of output signals 620-628 to circuit 700. In addition to input lines 710-718, circuit 700 comprises a set of NOR outputs: X 722, Y 724 and Z 726 (referred to collectively as NOR outputs 722-726). NOR outputs 722-726 are initialized at a high voltage by respective pull-up circuits 730, which can be affected by sets of programmable memory circuits 740, 742, 744, 746 and 758 (referred to collectively as memory circuits 740-748). In some embodiments, circuit 700 can be configured such that a selected NOR output (e.g., determinative of a downstream port address associated with a network address input at signal inputs 601-606 of circuit 600) is defined as one of NOR outputs 722-726 that changes from the high, initialized voltage to a low voltage in response to receipt of output signals 620-628. In other embodiments, circuit 700 can be configured such that the selected NOR output is defined as the NOR output that remains at the high initialized voltage in response to receipt of output signals 620-628—depending on the programming patterns of the sets of memory circuits.

Each memory circuit of the sets of programmable memory circuits 740-748 comprises a transistor and a two-terminal resistive-switching memory. A source of the transistor is connected to one of NOR outputs 722-726, and a drain of the transistor is connected to a first terminal of an associated two-terminal resistive-switching memory. The gate of the transistor is connected to one of input lines 710-718, and the second terminal of the two-terminal resistive-switching memory is connected to ground. In response to a high voltage (e.g., the default voltage) on an associated one of input lines 710-716, the transistor is activated connecting the NOR output to the first terminal of the two-terminal resistive-switching memory. If the memory is programmed (e.g., low resistance state), activation of the transistor provides a low resistance path to ground in parallel to the NOR output. This low resistance path to ground effectively reduces the initial high voltage on the NOR output. If the memory is erased (e.g., high resistance state), little current flows through the memory circuit, maintaining (or substantially maintaining) the initial high voltage on the NOR output.

By programming only a single memory circuit of each set of programmable memory circuits 740-748, each input line 710-718 is correlated with a reduced voltage on only one of NOR outputs 722-726 (the NOR output connected to the programmed memory circuit). In some embodiments, only a single memory circuit of each set of programmable memory circuits 740-748 is erased; in this case, each input line 710-718 is correlated with the initial high voltage on only one of NOR outputs 722-726 (the NOR output connected to the erased memory circuit). With either convention, respective subsets of input lines 710-718 can be correlated to respective ones of NOR outputs 722-726, such that the default voltage at one of output signals 620-628 can be correlated to one of NOR outputs 722-726, for each of output signals 620-628. For some applications, however, each input line 710-718 can be correlated with multiple NOR outputs 722-726, or no NOR outputs 722-726, depending on programming of sets of memory circuits 740-748.

High or low voltages on NOR outputs 722-726 are referred to as NOR output signals, and include NOR output signals X, Y and Z. For the example illustrated by FIG. 7, output signals M 620 and O 624 are correlated with a low voltage NOR output signal X on NOR output 722 (thus, Xb corresponds with M 620 and O 624; or in different form: X correlates to (M+O)b). Likewise, output signal R 626 is correlated with a low voltage NOR output signal Y, and output signals N 622 and S 628 are correlated with a low voltage NOR output signal Z.

In continuing the example router device application described above, respective NOR outputs 722-726 can be associated with respective downstream port addresses. When one of NOR outputs 722-726 changes to a low voltage (or maintains a high voltage, depending on programming) in response to an input at circuit 600, that NOR output and its associated downstream port address is selected by circuit 700. Association of network addresses (represented by output signals 620-628) and downstream port addresses can be changed by reprogramming sets of memory circuits 740-748. By expanding circuit 700, additional input lines 710-718 can be provided to accommodate larger numbers of network addresses. Likewise, additional NOR outputs 722-726 can be provided to accommodate larger numbers of downstream port addresses. Some sets of memory circuits 740-748 can be left unprogrammed, while other sets of memory circuits 740-748 are programmed, where fewer network addresses are available than input lines 712-718. Unprogrammed sets of memory circuits 740-748 can be later programmed to reflect added network address program patterns at circuit 600, for instance, and associate the added network address to a downstream port address. Further, where more NOR outputs 722-726 than downstream port addresses exist, one or more memory circuits for each set of memory circuits 742-748 can be left unprogrammed and the extra NOR outputs 722-726 can be unassigned to a downstream port address. If additional downstream port addresses are later associated with the extra NOR outputs 722-726, the one or more memory circuits connected to the extra NOR outputs 722-726 can then be programmed. Thus, circuits 600 and 700 can provide a lookup table that can store address data, and downstream port associations, and further can be expanded to accommodate more (or contracted to accommodate fewer) addresses or downstream port associations.

Figure 8:
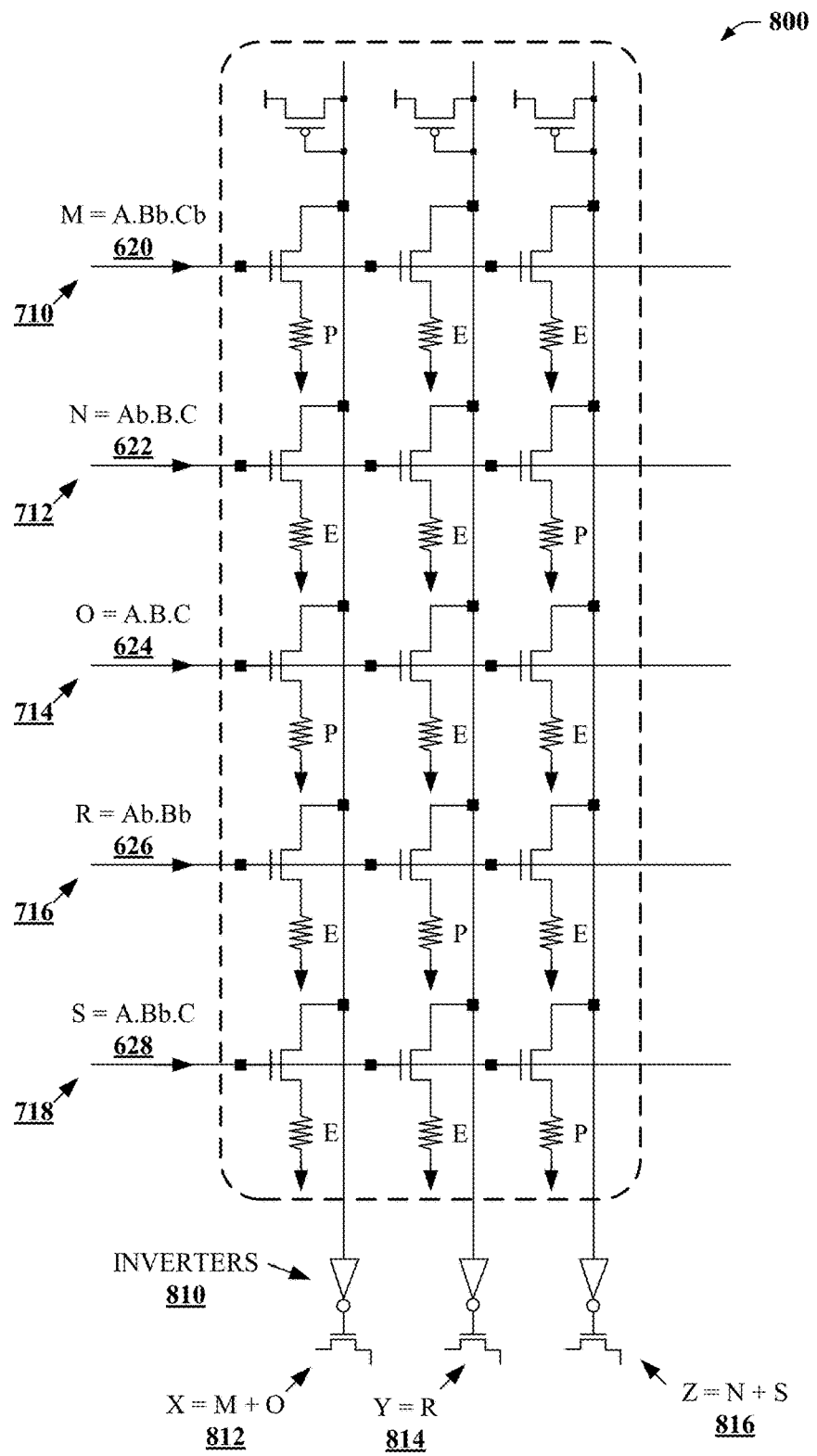
FIG. 8 depicts a schematic diagram of an alternate programmable circuit for performing a logical NOR operation.

FIG. 8 illustrates a schematic diagram of an example circuit 800 according to alternative embodiments of the present disclosure. Circuit 800 can have input lines 710-718, NOR outputs 722-726, pull-up circuits 730 and sets of memory circuits 740-748 substantially similar to circuit 700 of FIG. 7, supra, in at least some embodiments. Further, circuit 800 can receive output signals 620-628 as inputs, and select a NOR output in response to a set of output signals 620-628, based on programming of the sets of memory circuits 740-748 and values of the set of output signals 620-628. In addition to the foregoing, circuit 800 can further comprise a set of inverters 810 connected to NOR outputs 722-726, providing inverted outputs, including: inverted output X 812, inverted output Y 814 and inverted output Z 816 (referred to collectively as inverted NOR outputs 812-816). The inverted NOR outputs 812-816 generate a high signal (e.g., default voltage generated by pull-up circuits 730) in response to an associated NOR output voltage being pulled down, and is low in response to the associated NOR output voltage maintaining the high voltage. Accordingly, utilizing inverted NOR outputs 812-816, a selected output from circuit 800 is a high signal, utilizing the same programming illustrated by sets of memory circuits 740-478 of FIG. 7.

The aforementioned diagrams have been described with respect to interaction between several components of an electronic device, an input, an output, a memory circuit, or memory architecture. It should be appreciated that in some suitable alternative aspects of the subject disclosure, such diagrams can include those components, inputs, outputs, architectures, etc., specified therein, some of the specified components/inputs/outputs/architectures, or additional components/inputs/outputs/architectures. Sub-components can also be implemented as connected to other sub-components rather than included within a parent component. For example, multiple memory banks can be provided on separate memory chips, instead of on a single chip. Additionally, it is noted that one or more disclosed processes can be combined into a single process providing aggregate functionality. Components of the disclosed devices/architectures can also interact with one or more other components not specifically described herein but known by those of skill in the art.

Figure 9:
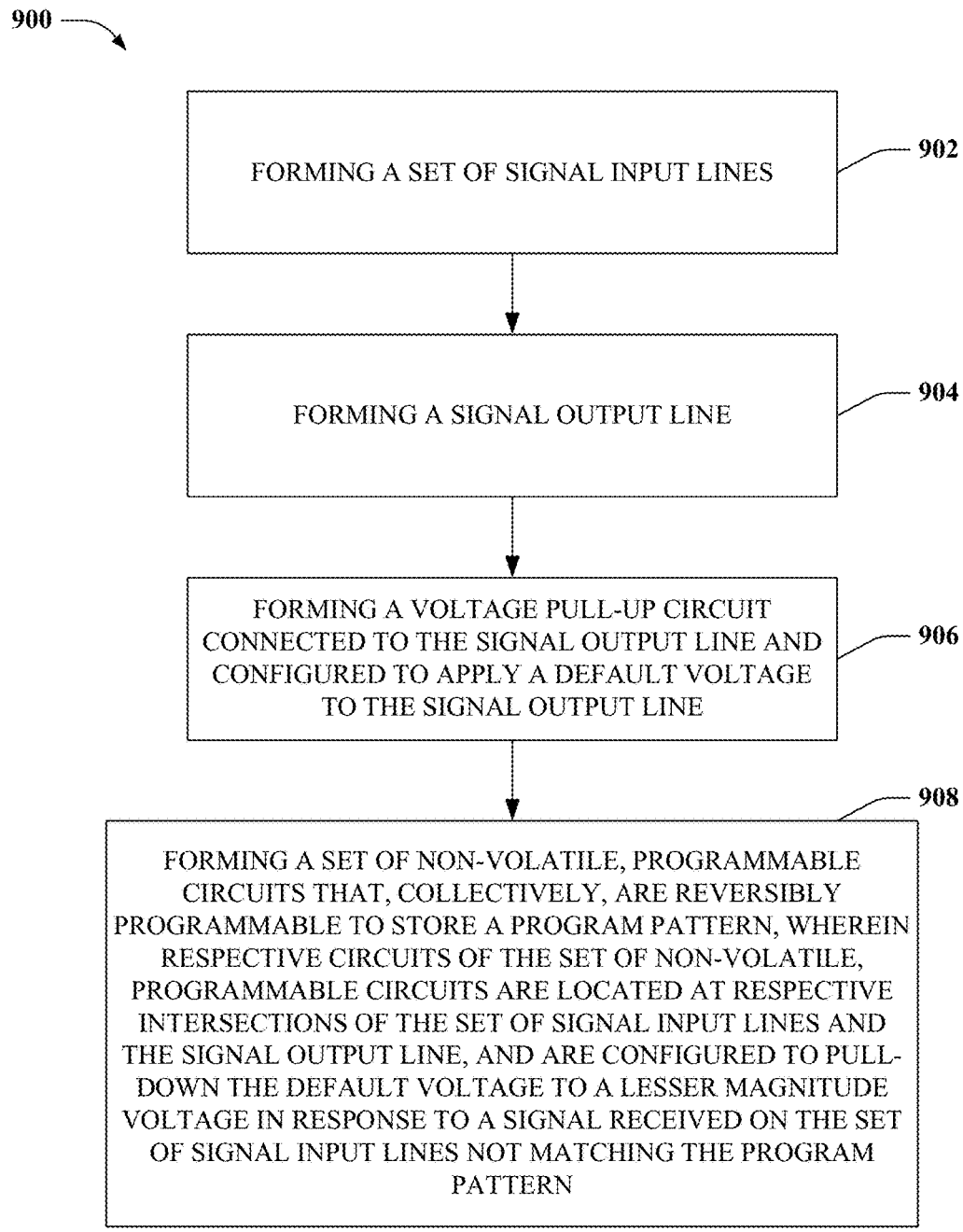
FIG. 9 illustrates a flowchart of a sample method for fabricating a programmable circuit according to one or more disclosed embodiments.
Figure 10:
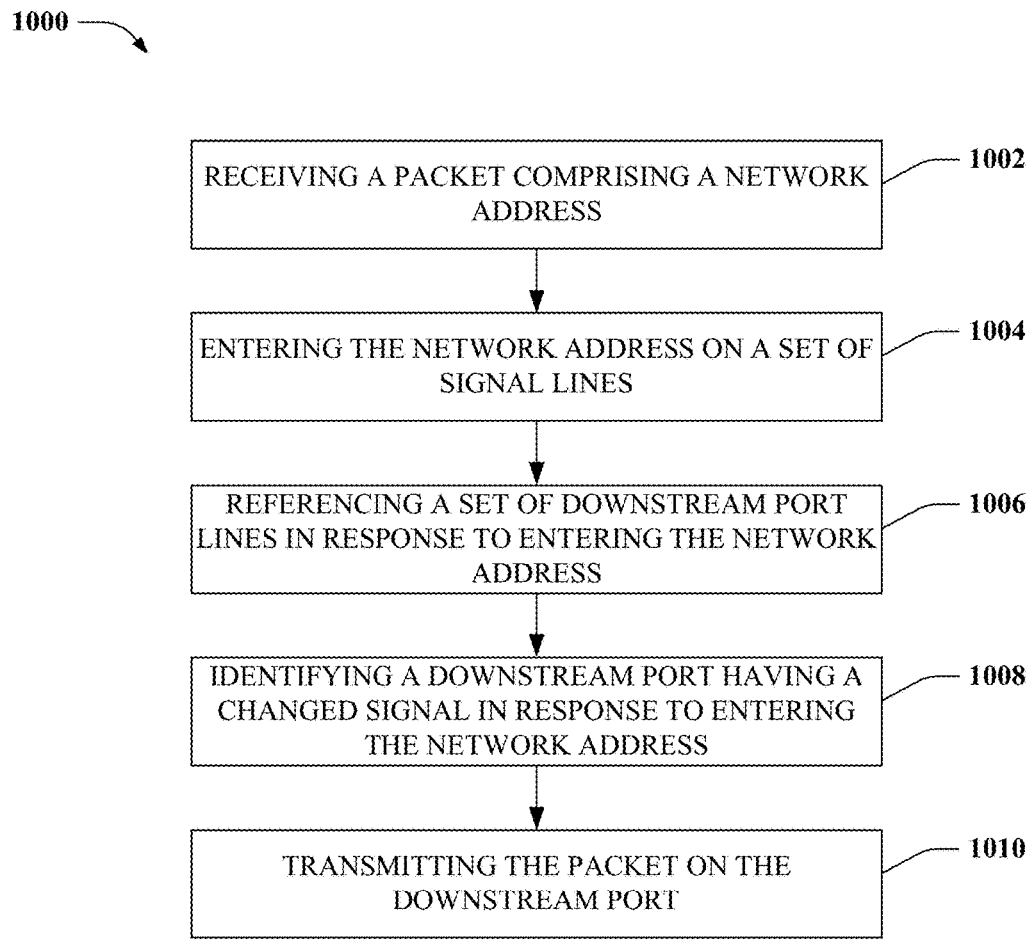
FIG. 10 illustrates a flowchart of an example method for operating a router device utilizing a programmable logic circuit, in further embodiments.

In view of the exemplary diagrams described supra, process methods that can be implemented in accordance with the disclosed subject matter will be better appreciated with reference to the flow charts of FIGS. 9-10. While for purposes of simplicity of explanation, the methods of FIGS. 9-10 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 9 depicts a flowchart of a sample method 900 for fabricating an electronic circuit, according to one or more further embodiments of the present disclosure. At 902, method 900 can comprise forming a set of signal input lines, and at 904, forming a signal output line. In various embodiments, method 900 can comprise forming a plurality of signal output lines, including the signal output line. Additionally, at 906, method 900 can comprise forming a voltage pull-up circuit connected to the signal output line and configured to apply a default voltage to the signal output line. At 908, method 900 can further comprise forming a set of non-volatile, programmable circuits that, collectively, are reversibly programmable to store a program pattern. In one or more embodiments, respective circuits of the set of non-volatile, programmable circuits can be located at respective intersections of the set of signal input lines and the signal output line, and can be configured to pull-down the default voltage to a lesser magnitude voltage in response to a signal received on the set of signal input lines not matching the program pattern.

In further embodiments of method 900, forming the set of non-volatile, programmable circuits can further comprise forming a two-terminal resistance-switching memory device having a first terminal connected to a first of the set of signal input lines, and a second terminal connected to the signal output line. In yet another embodiment of method 900, forming the set of non-volatile, programmable circuits can further comprise forming a transistor comprising a gate, a source and a drain, connecting the gate to a first of the set of signal input lines, and connecting the source to the signal output line. Additionally, method 900 can comprise forming a two-terminal resistance-switching memory device having a first terminal and a second terminal, and connecting the first terminal to the drain and connecting the second terminal to the ground.

In further embodiments, method 900 can comprise forming a distribution circuit and connecting the signal output line to an input of the distribution circuit. In one or more additional embodiments, forming the distribution circuit can further comprise forming a set of distribution circuit output lines, and associating respective ones of the set of distribution circuit output lines with a downstream transmission node of a router device. Forming the distribution circuit can additionally comprise forming a second set of non-volatile, programmable circuits configured to select one of the set of distribution circuit output lines for the signal output line, in response to receiving the default voltage from the signal output line at the input of the distribution circuit, in an embodiment. Moreover, forming the second set of non-volatile programmable circuits can further comprise forming a transistor comprising a gate, a source and a drain, connecting the gate to the input of the distribution circuit, connecting the source to a first of the set of distribution circuit output lines, forming a two-terminal resistance-switching memory device having a first terminal and a second terminal, connecting the first terminal to the drain and connecting the second terminal to ground. In further embodiments, method 900 can comprise forming a distribution circuit pull-up device connected to and configured to apply a second default voltage to the first of the set of distribution circuit output lines. In an embodiment, the transistor and the two-terminal resistance-switching memory device can be configured to reduce the second default voltage on the first of the set of distribution circuit output lines, in response to the input of the distribution circuit equaling the default voltage, and in response to the two-terminal resistance-switching memory device being programmed to a low resistance state.

FIG. 10 depicts a flowchart of a sample method 1000 for operating a network routing device, in an embodiment. At 1002, method 1000 can comprise receiving a packet comprising a network address. At 1004, method 1000 can comprise entering the network address on a set of signal lines. The signal lines can be inputs into a logical AND circuit comprising programmable non-volatile resistance-switching memory storage circuits, in an embodiment. At 1006, method 1000 can comprise referencing a set of downstream port lines in response to entering the network address. In an embodiment, the downstream port lines can be output lines of a logical NOR circuit comprising programmable non-volatile resistance-switching memory storage circuits. At 1008, method 1000 can comprise identifying a downstream port line having a changed signal in response to entering the network address. At 1010, method 1000 can comprise transmitting the packet on the identified downstream port.

Figure 11:
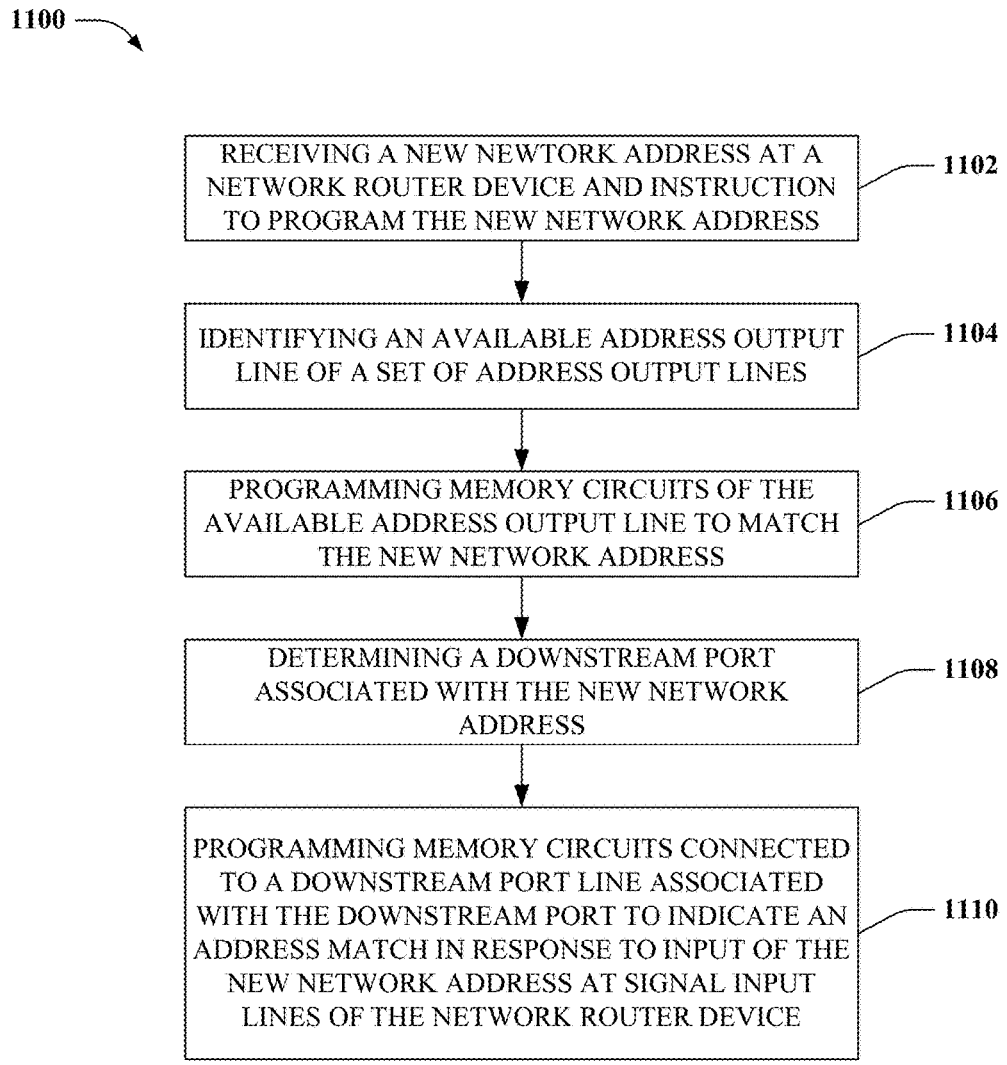
FIG. 11 depicts a flowchart of a sample method for updating a network addresses of a network router device, in one or more embodiments.

FIG. 11 illustrates a flowchart of a sample method 1100 for operating a disclosed network router device, in an embodiment(s). At 1102, method 1100 can comprise receiving a new network address at a network router device and instruction to program the new network address. In an embodiment, the new network address can be an IP address, or other suitable networking address. Further, the new network address can be received in conjunction with a network program instruction. At 1104, method 1100 can comprise identifying an available address output line of a set of address output lines of the network router device. At 1106, method 1100 can comprise programming memory circuits of the available address output line to match the new network address. At 1108, method 1100 can comprise determining a downstream port associated with the new network address. At 1110, method 1100 can comprise programming memory circuits connected to a downstream port line associated with the downstream port to indicate an address match in response to input of the new network address at signal input lines of the network router device.

In an embodiment, method 1100 can comprise receiving an association between the new network address and a downstream port address and, in response to determining that the downstream port address is not currently associated with the set of downstream port lines of the network router device, identifying an unassociated downstream port line, activating a memory circuit connecting the available address output line to the unassociated downstream port line and storing an association between the unassociated downstream port line and the downstream port address. In a further embodiment, method 1100 can comprise, in response to determining that the downstream port address is currently associated with a downstream port line of the network router device, activating a memory circuit connecting the available address output line to the associated downstream port line.

In a further embodiment, programming memory circuits of the available address output line can comprise, in response to a first bit of the new network address being a '1', erasing a first memory element of the non-volatile memory circuit associated with the first bit of the new address (e.g., the two-terminal, non-volatile memory device of memory circuit 211 connected to input line A 201 of FIG. 2, supra) and programming a second memory element of the non-volatile memory circuit associated with an inverse of the first bit of the new address (e.g., the two-terminal, non-volatile memory device of memory circuit 212 connected to input line Ab 202 of FIG. 2). In another embodiment, programming memory circuits of the available address output line can comprise, in response to a first bit of the new network address being a '0', programming the first memory element of the non-volatile memory circuit associated with the first bit of the new address and erasing the second memory element of the non-volatile memory circuit associated with an inverse of the first bit of the new address.

Figure 12:
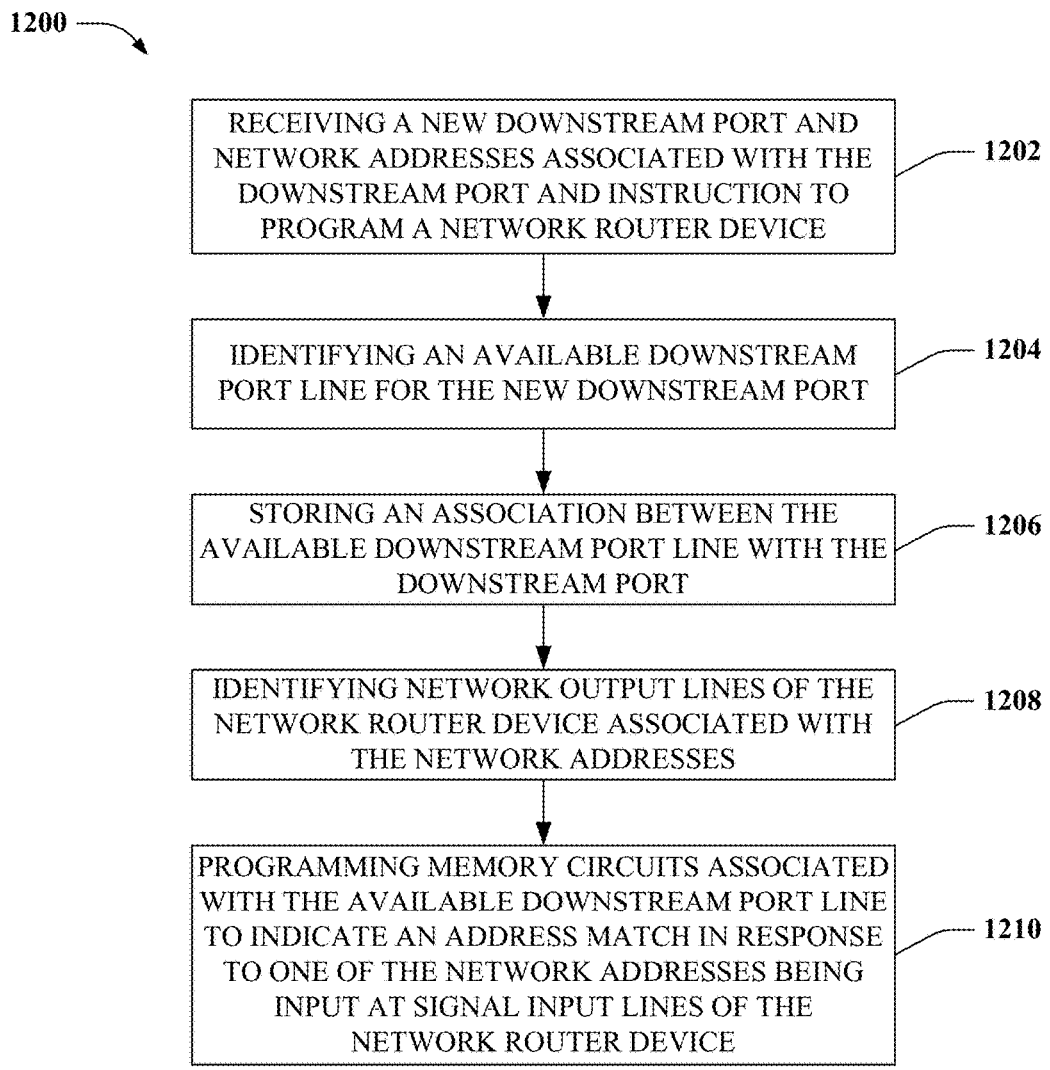
FIG. 12 illustrates a flowchart of a sample method for updating downstream port associations of a network router device, in further embodiments.

FIG. 12 illustrates a flowchart of a sample method 1200 for operating a disclosed network router device according to alternative or additional embodiments. The network router device can comprise programmable circuitry for linking a reconfigurable set of network addresses to a reconfigurable set of downstream ports, and can comprise a set of input lines connected to a set of network address outputs and a first programmable array of memory circuits for mapping respective network addresses to respective network address outputs. Moreover, the set of network address outputs can serve as inputs to a set of downstream port lines that are respectively associated with the set of downstream ports and having a second programmable array of memory circuits associating respective subsets of the network address outputs to respective ones of the set of downstream port lines.

Further, at 1202, method 1200 can comprise receiving a new downstream port and network addresses associated with the downstream port and instruction to program a network router device. At 1204, method 1200 can comprise identifying an available downstream port line for the new downstream port. At 1206, method 1200 can comprise storing an association between the available downstream port line with the downstream port. Further, at 1208, method 1200 can comprise identifying network output lines of the network router device associated with the network addresses. At 1210, method 1200 can comprise programming memory circuits associated with the available downstream port line to indicate an address match in response to one of the network addresses being input at signal input lines of the network router device. In an embodiment, programming a memory cell of the memory circuits associated with the available downstream port line can comprise setting a non-volatile memory element of the memory cell to a low resistance memory state.

In another embodiment, method 1200 can comprise erasing a second memory cell of the memory circuits connected to the available downstream port line and to a second network address output of the set of network address outputs, to disassociate a second network address associated with the second network address output from the downstream port line and the downstream port address. In yet another embodiment, method 1200 can comprise receiving a new network address to be added to the reconfigurable set of network addresses and to associate with the downstream port address. Method 1200 can further comprise identifying an available network address output of the set of network address outputs and programming a memory circuit of the first programmable array of memory circuits connected to the available network address output to match the new network address. Additionally, method 1200 can comprise programming a second memory cell of the second programmable array of memory circuits connected to the available downstream port line and to the available network address output to associate the new network address with the downstream port line and the downstream port address.

Figure 13:
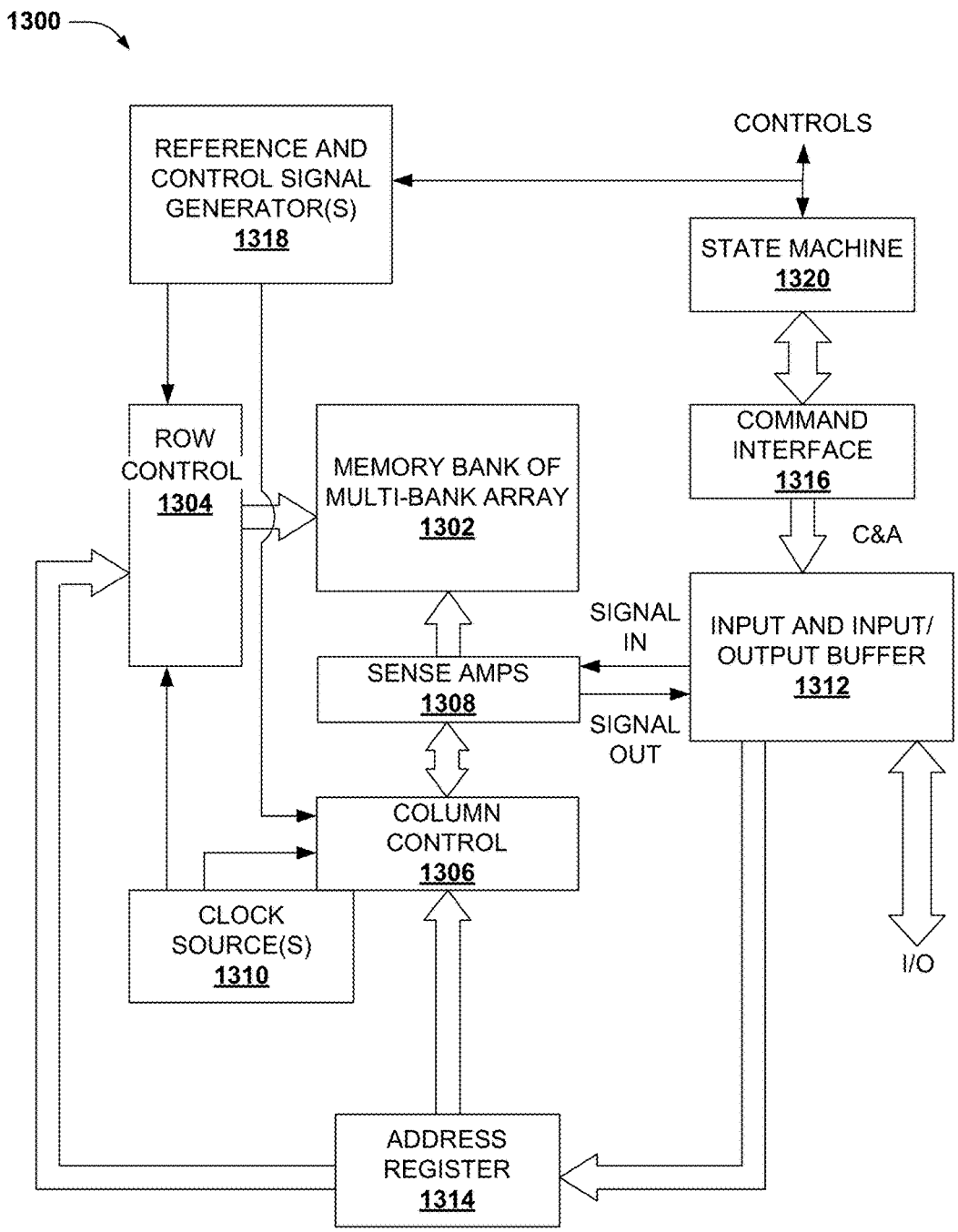
FIG. 13 illustrates block diagram of a sample operating environment for facilitating implementation of one or more aspects disclosed herein.

In order to provide a context for the various aspects of the disclosed subject matter, FIG. 13, as well as the following discussion, is intended to provide a brief, general description of a suitable environment in which various aspects of the disclosed subject matter can be implemented or processed. While the subject matter has been described above in the general context of electronic memory or architectures and process methodologies for operating such memory or architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 1402 of FIG. 14, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 13 illustrates a block diagram of an example operating and control environment 1300 for a memory bank 1302 of a memory cell array according to aspects of the subject disclosure. In at least one aspect of the subject disclosure, memory bank 1302 can comprise memory selected from a variety of memory cell technologies. In at least one embodiment, memory bank 1302 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing. In a further embodiment, memory bank 1302 can comprise a status register (not depicted) configured to generate and output status information pertinent to memory bank 1302. In yet another embodiment, memory bank 1302 can be configured to operate according to a first set of configurations (e.g., MLC, SLC, operation voltage, clock speed, latency, etc.) that is at least in part different from a second set of configurations of a second memory bank (not depicted) of the array of memory.

A column controller 1306 and sense amps 1308 can be formed adjacent to memory bank 1302. Moreover, column controller 1306 can be configured to activate (or identify for activation) a subset of bitlines of memory bank 1302. Column controller 1306 can utilize a control signal provided by a reference and control signal generator(s) 1318 to activate, as well as operate upon, respective ones of the subset of bitlines, applying suitable program, erase or read voltages to those bitlines. Non-activated bitlines can be kept at an inhibit voltage (also applied by reference and control signal generator(s) 1318), to mitigate or avoid bit-disturb effects on these non-activated bitlines.

In addition, operating and control environment 1300 can comprise a row controller 1304. Row controller 1304 can be formed adjacent to and electrically connected with word lines of memory bank 1302. Further, utilizing control signals of reference and control signal generator(s) 1318, row controller 1304 can select particular rows of memory cells with a suitable selection voltage. Moreover, row controller 1304 can facilitate program, erase or read operations by applying suitable voltages at selected word lines.

Sense amps 1308 can read data from, or write data to the activated memory cells of memory bank 1302, which are selected by column control 1306 and row control 1304. Data read out from memory bank 1302 can be provided to an input and input/output buffer 1312. Likewise, data to be written to memory bank 1302 can be received from the input and input/output buffer 1312 and written to the activated memory cells of memory bank 1302.

A clock source(s) 1310 can provide respective clock pulses to facilitate timing for read, write, and program operations of row controller 1304 and column controller 1306. Clock source(s) 1310 can further facilitate selection of wordlines or bitlines in response to external or internal commands received by operating and control environment 1300. Input and input/output buffer 1312 can comprise a command and address input, as well as a bidirectional data input and output. Instructions are provided over the command and address input, and the data to be written to memory bank 1302 as well as data read from memory bank 1302 is conveyed on the bidirectional data input and output, facilitating connection to an external host apparatus, such as a computer or other processing device (not depicted, but see e.g., computer 1402 of FIG. 14, infra).

Input and input/output buffer 1312 can be configured to receive write data, receive an erase instruction, receive a status or maintenance instruction, output readout data, output status information, and receive address data and command data, as well as address data for respective instructions. Address data can be transferred to row controller 1304 and column controller 1306 by an address register 1310. In addition, input data is transmitted to memory bank 1302 via signal input lines between sense amps 1308 and input and input/output buffer 1312, and output data is received from memory bank 1302 via signal output lines from sense amps 1308 to input and input/output buffer 1312. Input data can be received from the host apparatus, and output data can be delivered to the host apparatus via the I/O bus.

Commands received from the host apparatus can be provided to a command interface 1316. Command interface 1316 can be configured to receive external control signals from the host apparatus, and determine whether data input to the input and input/output buffer 1312 is write data, a command, or an address. Input commands can be transferred to a state machine 1320.

State machine 1320 can be configured to manage programming and reprogramming of memory bank 1302 (as well as other memory banks of the multi-bank memory array). Instructions provided to state machine 1320 are implemented according to control logic configurations, enabling state machine 1320 to manage read, write, erase, data input, data output, and other functionality associated with memory bank 1302. In some aspects, state machine 1320 can send and receive acknowledgments and negative acknowledgments regarding successful receipt or execution of various commands. In further embodiments, state machine 1320 can decode and implement status-related commands, decode and implement configuration commands, and so on.

To implement read, write, erase, input, output, etc., functionality, state machine 1320 can control clock source(s) 1308 or reference and control signal generator(s) 1318. Control of clock source(s) 1308 can cause output pulses configured to facilitate row controller 1304 and column controller 1306 implementing the particular functionality. Output pulses can be transferred to selected bitlines by column controller 1306, for instance, or wordlines by row controller 1304, for instance.

In connection with FIG. 14, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 14:
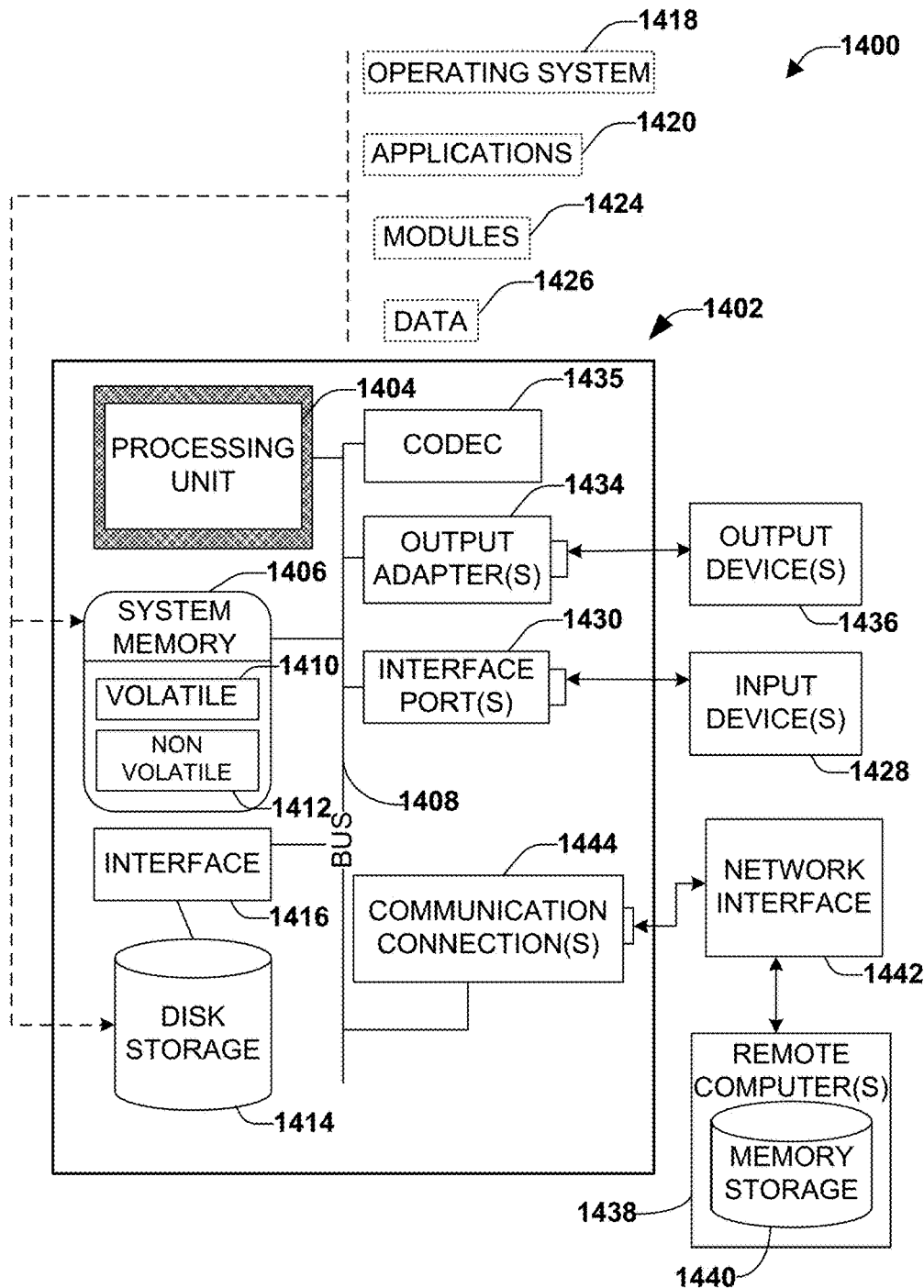
FIG. 14 illustrates a block diagram of an example computing environment that can be implemented in conjunction with various embodiments.

With reference to FIG. 14, a suitable operating environment 1400 for implementing various aspects of the claimed subject matter includes a computer 1402. The computer 1402 includes a processing unit 1404, a system memory 1406, a codec 1435, and a system bus 1408. The system bus 1408 couples system components including, but not limited to, the system memory 1406 to the processing unit 1404. The processing unit 1404 can be any of various available processors. Dual microprocessors and other multiprocessor architectures also can be employed as the processing unit 1404.

The system bus 1408 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1406 includes volatile memory 1410 and non-volatile memory 1414, which can employ one or more of the disclosed memory architectures, in various embodiments. The basic input/output system (BIOS), containing the basic routines to transfer information between elements within the computer 1402, such as during start-up, is stored in non-volatile memory 1412. In addition, according to present innovations, codec 1435 may include at least one of an encoder or decoder, wherein the at least one of an encoder or decoder may consist of hardware, software, or a combination of hardware and software. Although, codec 1435 is depicted as a separate component, codec 1435 may be contained within non-volatile memory 1412. By way of illustration, and not limitation, non-volatile memory 1412 can include read only memory (ROM), programmable ROM (PROM), electrically programmable ROM (EPROM), electrically erasable programmable ROM (EEPROM), or Flash memory. Non-volatile memory 1412 can employ one or more of the disclosed memory architectures, in at least some disclosed embodiments. Moreover, non-volatile memory 1412 can be computer memory (e.g., physically integrated with computer 1402 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1410 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1402 may also include removable/non-removable, volatile/non-volatile computer storage medium. FIG. 14 illustrates, for example, disk storage 1414. Disk storage 1414 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1414 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1414 to the system bus 1408, a removable or non-removable interface is typically used, such as interface 1416. It is appreciated that disk storage 1414 can store information related to a user. Such information might be stored at or provided to a server or to an application running on a user device. In one embodiment, the user can be notified (e.g., by way of output device(s) 1436) of the types of information that are stored to disk storage 1414 and/or transmitted to the server or application. The user can be provided the opportunity to opt-in or opt-out of having such information collected and/or shared with the server or application (e by way of input from input device(s) 1428).

It is to be appreciated that FIG. 14 describes software that acts as an intermediary between users and the basic computer resources described in the suitable operating environment 1400. Such software includes an operating system 1418. Operating system 1418, which can be stored on disk storage 1414, acts to control and allocate resources of the computer 1402. Applications 1420 take advantage of the management of resources by operating system 1418 through program modules 1424, and program data 1426, such as the boot/shutdown transaction table and the like, stored either in system memory 1406 or on disk storage 1414. It is to be appreciated that the claimed subject matter can be implemented with various operating systems or combinations of operating systems.

A user enters commands or information into the computer 1402 through input device(s) 1428. Input devices 1428 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1404 through the system bus 1408 via interface port(s) 1430. Interface port(s) 1430 include, for example, a serial port, a parallel port, a game port, and a universal serial bus (USB). Output device(s) 1436 use some of the same type of ports as input device(s) 1428. Thus, for example, a USB port may be used to provide input to computer 1402 and to output information from computer 1402 to an output device 1436. Output adapter 1434 is provided to illustrate that there are some output devices, such as monitors, speakers, and printers, among other output devices, which require special adapters. The output adapter 1434 can include, by way of illustration and not limitation, video and sound cards that provide a means of connection between the output device 1436 and the system bus 1408. It should be noted that other devices and/or systems of devices provide both input and output capabilities such as remote computer(s) 1438.

Computer 1402 can operate in a networked environment using logical connections to one or more remote computers, such as remote computer(s) 1438. The remote computer(s) 1438 can be a personal computer, a server, a router, a network PC, a workstation, a microprocessor based appliance, a peer device, a smart phone, a tablet, or other network node, and typically includes many of the elements described relative to computer 1402. For purposes of brevity, only a memory storage device 1440 is illustrated with remote computer(s) 1438. Remote computer(s) 1438 is logically connected to computer 1402 through a network interface 1442 and then connected via communication connection(s) 1444. Network interface 1442 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1444 refers to the hardware/software employed to connect the network interface 1442 to the system bus 1408. While communication connection 1444 is shown for illustrative clarity inside computer 1402, it can also be external to computer 1402. The hardware/software necessary for connection to the network interface 1442 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for operating a network router device, comprising:
receiving a data packet comprising a network address at an input interface of the network router device;
entering the network address onto a set of input signal lines of the network router device;
referencing a set of downstream port lines of the network router device in response to entering the network address, wherein the set of input signal lines generate network address outputs that serve as inputs to respective sets of memory circuits coupled to downstream port lines of the set of downstream port lines, a memory circuit of the set of memory circuits comprising a two-terminal resistive memory device and no more than one transistor;
measuring output signals of the set of downstream port lines in response to entering the network address;
identifying a downstream port line of the set of downstream port lines that is associated with the network address from measured output signals of the set of downstream port lines; and
transmitting the data packet on a downstream port associated with the downstream port line.

2. The method of claim 1, wherein entering the network address onto the set of input signal lines further comprises applying respective bits of the network address to respective paired input lines of the set of input signal lines.

3. The method of claim 2, wherein the applying the respective bits of the network address to the respective paired input signal lines further comprises entering:
a first bit signal representing a first bit of the network address onto a first bit input line of the respective paired input lines; and an inverted first bit signal that represents an inversion of the first bit of the network address onto a first inverted bit input line of the respective paired input lines.

4. The method of claim 1, wherein identifying the downstream port line of the set of downstream port lines further comprises determining a modified signal measurement for one of the output signals in response to entering the network address onto the set of input signal lines.

5. The method of claim 4, wherein the determining the modified signal measurement further comprises measuring a reduction in voltage on the downstream port line of the set of downstream port lines in response to entering the network address, and wherein identifying the downstream port line of the set of downstream port lines further comprises selecting the downstream port line associated with the reduction in voltage as the identified downstream port line.

6. The method of claim 4, further comprising inverting the output signals of the set of downstream port lines, and wherein measuring the output signals comprises measuring the inverted output signals, and further wherein determining the modified signal measurement further comprises measuring an increase in voltage on the downstream port line of the set of downstream port lines in response to entering the network address, and wherein identifying the downstream port line of the set of downstream port lines further comprises selecting the downstream port line associated with the increase in voltage as the identified downstream port line.

7. The method of claim 1, wherein identifying the downstream port line of the set of downstream port lines further comprises determining one of the output signals that retains a digital state in response to entering the network address onto the set of input signal lines.

8. The method of claim 1, further comprising;
receiving an address program instruction in conjunction with a new network address, wherein the program instruction instructs the network router device to add the new network address to the input lines of the network router device;
identifying an address line of the network router device available for storing the new network address; and
programming memory circuits on the identified address line and connected to the set of input signal lines to match bits of the new network address.

9. The method of claim 1, further comprising:
receiving an address routing instruction in conjunction with a downstream port address and a network address, wherein the address routing instruction instructs the network router device to map the network address to the downstream port address;
identifying a network address line of the network router device programmed to the network address received with the address routing instruction; and
associating one of the set of downstream port lines with the downstream port address; and programming one of the sets of the memory circuits that is coupled to the one of the set of downstream port lines and connected to the identified network address line to generate an output signal match on the one of the set of downstream port lines in response to entry of the network address on the set of input signal lines.

10. The method of claim 1, further comprising:
receiving a new network address in conjunction with a network program instruction for the network router device;
receiving an association between the new network address and a downstream port address;
programming memory circuits of an available address line of the network router device according to the new network address; and at least one of:
identifying an unassociated downstream port line, activating one of the sets of memory circuits connecting the available address line programmed with the new network address to the unassociated downstream port line and storing an association between the unassociated downstream port line and the downstream port address in response to determining that the downstream port address is not currently associated with the set of downstream port lines of the network router device; or
activating a second set of the memory circuits connecting the available address line programmed with the new network address to a second downstream port line of the set of downstream port lines associated with the downstream port address in response to determining the second downstream port line is associated with the downstream port address.

11. A method for operating a network router device comprising a set of address lines having respective non-volatile memory circuits for causing the set of address lines to generate a first output in response to an input match and to generate a second output in response to an input mismatch, and comprising a set of downstream port lines having respective second non-volatile memory circuits for associating respective subsets of the set of address lines with one of the set of downstream port lines, the respective non-volatile memory circuits comprising no more than one transistor per non-volatile memory element, the method comprising:
receiving a new address for programming to the network router device;
identifying an available address line of the set of address lines for the new address;
programming a non-volatile memory circuit, of the respective non-volatile memory circuits, connected to the available address line to match the new address, such that in response to input of the new address at the network router device the available address line generates the first output, wherein the programming the non-volatile memory circuit includes writing the new address to two-terminal resistive memory devices of the non-volatile memory circuit; and
programming one of the second non-volatile memory circuits, the programming including writing an association between the available address line and the one of the set of downstream port lines to a two-terminal resistive memory device of the second non-volatile memory circuits, causing identification of the one of the set of downstream port lines in response to the available address line generating the first output.

12. The method of claim 11, wherein programming the non-volatile memory circuit further comprises, in response to a first bit of the new address being a "1", erasing a first memory element of the non-volatile memory circuit associated with the first bit of the new address and programming a second memory element of the non-volatile memory circuit associated with an inverse of the first bit of the new address.

13. The method of claim 11, wherein programming the one of the non-volatile memory circuits further comprises, in response to a first bit of the new address being a "0", programming a first memory element of the non-volatile memory circuit associated with the first bit of the new address and erasing a second memory element of the non-volatile memory circuit associated with an inverse of the first bit of the new address.

14. The method of claim 11, further comprising determining a downstream port address for the new address.

15. The method of claim 14, further comprising programming one of the second non-volatile memory circuits connected to a downstream port line of the set of downstream port lines associated with the downstream port address to cause the downstream port line to generate a third output in response to the available address line generating the first output.

16. A method for operating a network router device comprising programmable circuitry for linking a reconfigurable network addresses to a reconfigurable set of downstream ports, the network router device comprising a set of input lines connected to a network address outputs and a first programmable array of memory circuits for mapping respective network addresses to respective network address outputs, the network address outputs serving as inputs to a set of downstream port lines, the set of downstream port lines respectively associated with the set of downstream ports and having a second programmable array of memory circuits associating respective subsets of the network address outputs to respective ones of the set of downstream port lines, the method comprising:
receiving a new downstream port address to be added to the reconfigurable set of downstream ports;
identifying an available downstream port line of the set of downstream port lines;
storing an association between the available downstream port line and the new downstream port; and
programming a memory cell of the second programmable array of memory circuits connected to the available downstream port line and to a network address output of the network address outputs to associate a network address programmed to the network address output with the downstream port line and the downstream port address, wherein the memory cell consists of a single non-volatile memory element connected at a first terminal thereof to a ground or a low voltage source, and connected at a second terminal thereof to a single transistor.

17. The method of claim 16, wherein programming the memory cell of the second programmable array of memory circuits further comprises setting the single non-volatile memory element of the memory cell to a low resistance memory state.

18. The method of claim 17, further comprising erasing a second memory cell of the second programmable array of memory circuits connected to the available downstream port line and to a second network address output of the network address outputs, to disassociate a second network address associated with the second network address output from the downstream port line and the downstream port address.

19. The method of claim 16, further comprising receiving a new network address to be added to the reconfigurable network addresses and to associate with the downstream port address.

20. The method of claim 19, further comprising:
identifying an available network address output of the network address outputs;
programming a memory circuit of the first programmable array of memory circuits connected to the available network address output to match the new network address; and
programming a second memory cell of the second programmable array of memory circuits connected to the available downstream port line and to the available network address output to associate the new network address with the downstream port line and the downstream port address.

* * * * *